(12) United States Patent
Hashimura et al.

(10) Patent No.: US 7,183,136 B2
(45) Date of Patent: Feb. 27, 2007

(54) SEMICONDUCTOR ELEMENT AND METHOD FOR PRODUCING THE SAME

(75) Inventors: Masaki Hashimura, Aichi (JP); Shigeki Konishi, Aichi (JP); Naohisa Nagasaka, Aichi (JP)

(73) Assignee: Toyoda Gosei Co., Ltd., Aichi (JP)

( * ) Notice: Subject to any disclaimer, the term of this patent is extended or adjusted under 35 U.S.C. 154(b) by 330 days.

(21) Appl. No.: 10/601,310

(22) Filed: Jun. 23, 2003

(65) Prior Publication Data

US 2005/0186760 A1 Aug. 25, 2005

(30) Foreign Application Priority Data

| Jun. 24, 2002 | (JP) | ............................ P2002-183730 |
| Nov. 8, 2002 | (JP) | ............................ P2002-326194 |
| Nov. 8, 2002 | (JP) | ............................ P2002-326195 |
| Jan. 22, 2003 | (JP) | ............................ P2003-013398 |

(51) Int. Cl.
  *H01L 21/44* (2006.01)
(52) U.S. Cl. ........................... 438/113; 438/33; 438/68; 438/460; 438/E21.559
(58) Field of Classification Search ................... 438/33, 438/68, 113, 460–462
  See application file for complete search history.

(56) References Cited

U.S. PATENT DOCUMENTS

| 5,888,883 A * | 3/1999 | Sasaki et al. ................ 438/460 |
| 6,294,439 B1 * | 9/2001 | Sasaki et al. ................ 438/464 |
| 6,720,522 B2 * | 4/2004 | Ikegami et al. ........ 219/121.69 |
| 6,805,808 B2 * | 10/2004 | Fujii et al. ...................... 216/52 |
| 6,906,993 B2 * | 6/2005 | Wang et al. ............. 369/275.3 |

FOREIGN PATENT DOCUMENTS

| JP | 53-62489 | 6/1978 |
| JP | 57-66650 | 4/1982 |
| JP | 62-272583 | 11/1987 |
| JP | 64-64811 | 3/1989 |
| JP | 1-113209 | 5/1989 |

(Continued)

OTHER PUBLICATIONS

Chinese Office Action dated Apr. 1, 2005, with English Translation.

*Primary Examiner*—Dung A. Le
(74) *Attorney, Agent, or Firm*—McGinn IP Law Group, PLLC

(57) ABSTRACT

A plurality of Group III nitride compound semiconductor layers are formed on a substrate for performing the formation of elements and the formation of electrodes. The Group III nitride compound semiconductor layers on parting lines are removed by etching or dicing due to a dicer so that only an electrode-forming layer on a side near the substrate remains or no Group III nitride compound semiconductor layer remains on the parting lines. A protective film is formed on the whole front surface. Separation grooves are formed in the front surface of the substrate by laser beam irradiation. The protective film is removed together with reaction products produced by the laser beam irradiation. The rear surface of the substrate 1s is polished to reduce the thickness of the substrate. Then, rear grooves corresponding to the latticed frame-shaped parting lines are formed in the rear surface of the substrate. The substrate is divided into individual elements along the parting lines.

17 Claims, 29 Drawing Sheets

FOREIGN PATENT DOCUMENTS

| | | |
|---|---|---|
| JP | 03-166923 | 7/1991 |
| JP | 4-142760 | 5/1992 |
| JP | 5-315646 | 11/1993 |
| JP | 7-131069 | 5/1995 |
| JP | 8-274371 | 10/1996 |
| JP | 9-97922 | 4/1997 |
| JP | 9-167858 | 6/1997 |
| JP | 10-163531 | 6/1998 |
| JP | 10-321908 | 12/1998 |
| JP | 11-126923 | 5/1999 |
| JP | 11-126924 | 5/1999 |
| JP | 11-163405 | 6/1999 |
| JP | 11-251633 | 9/1999 |
| JP | 2000-188421 | 7/2000 |
| JP | 2001-102673 | 4/2001 |
| JP | 2001-284292 | 10/2001 |
| JP | 2001-284293 | 10/2001 |
| JP | 2001-284642 | 10/2001 |
| JP | 2001-326194 | 11/2001 |

* cited by examiner

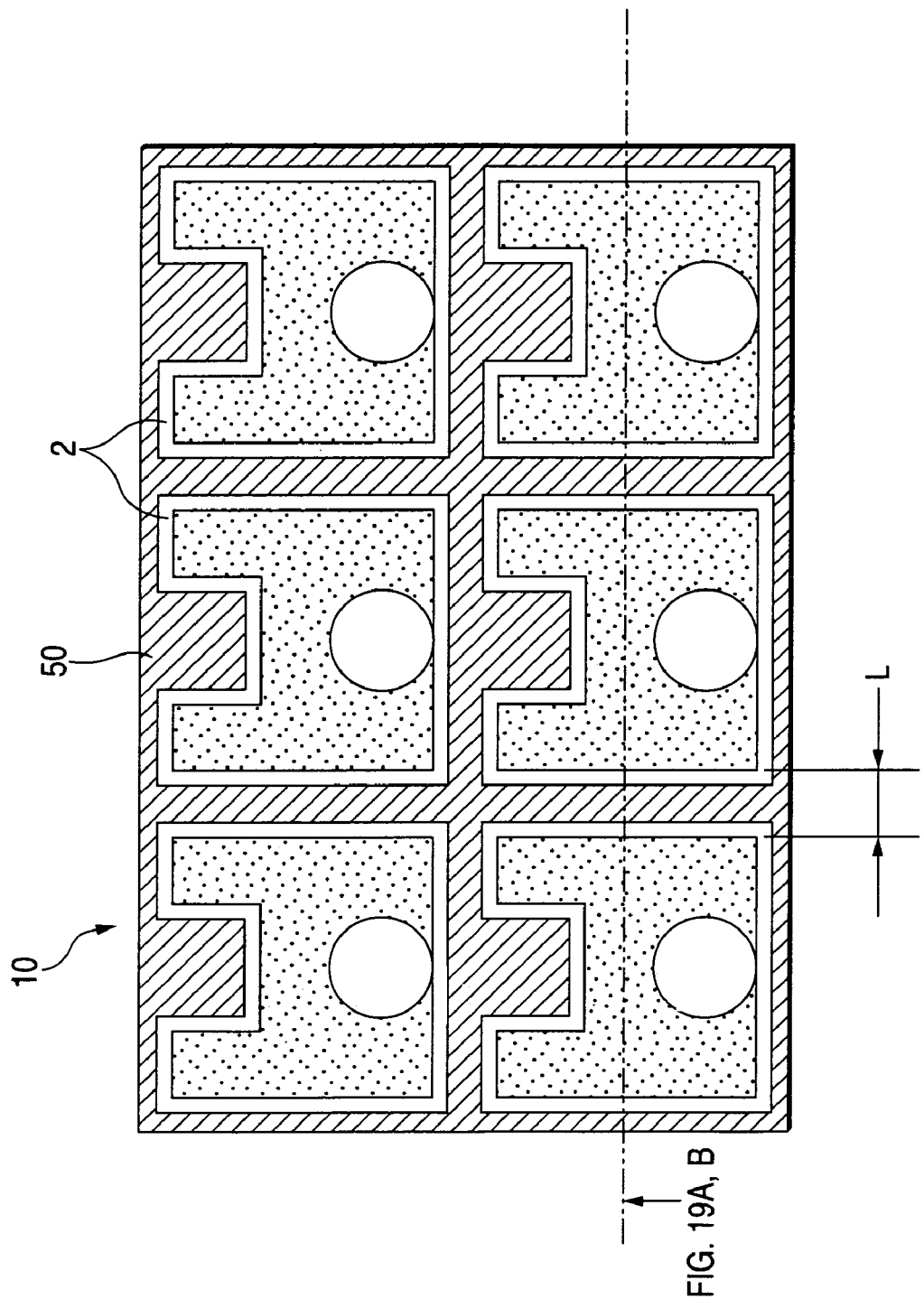

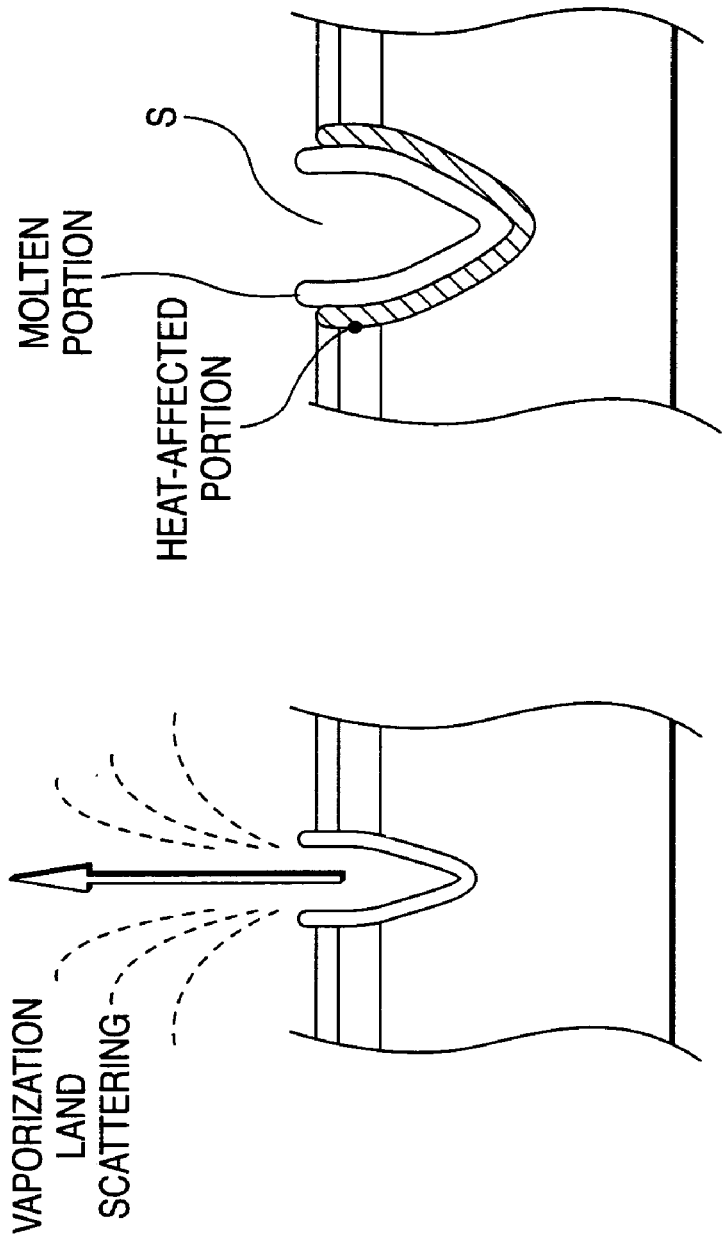

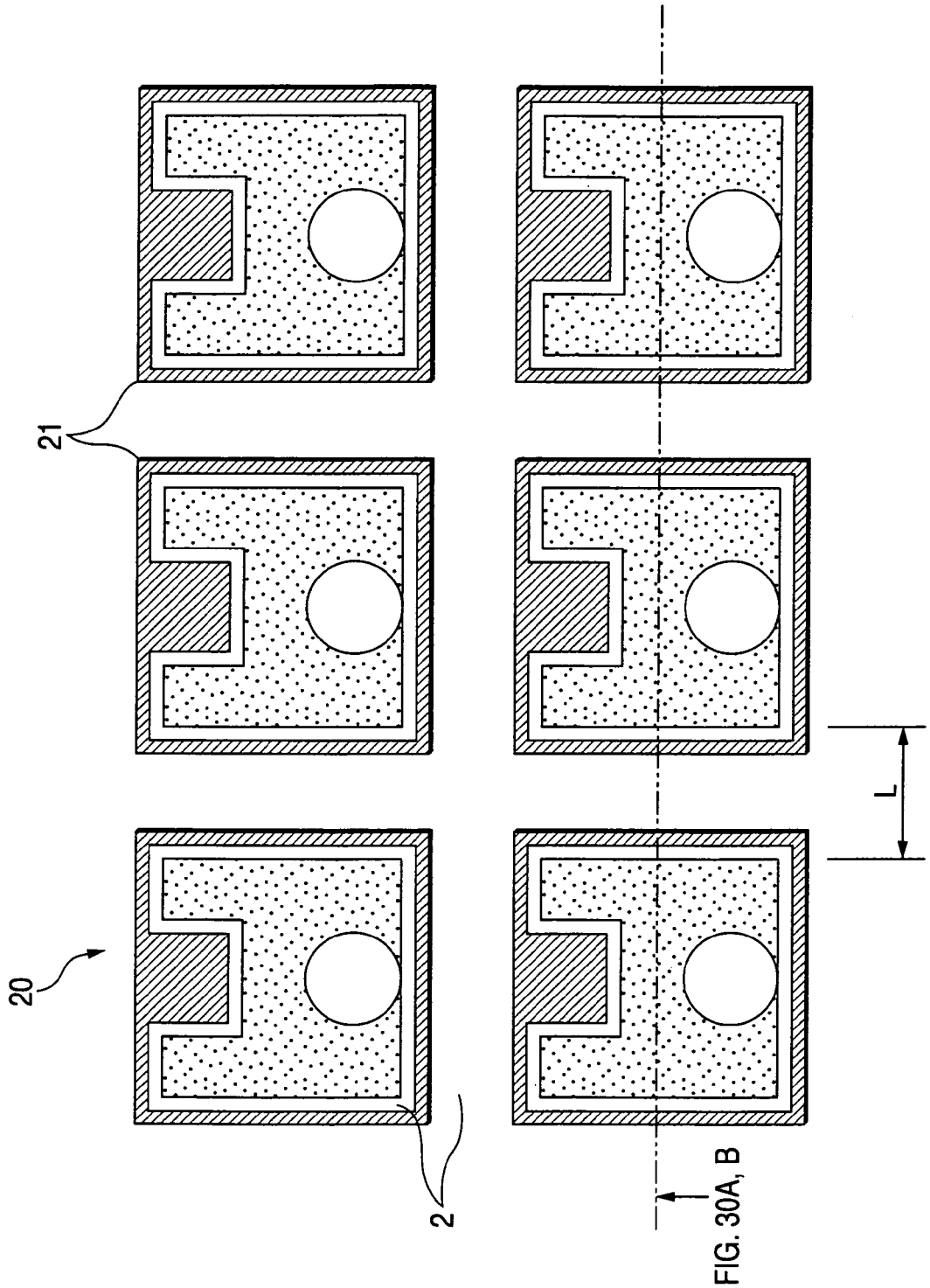

SEMICONDUCTOR ELEMENT AND METHOD FOR PRODUCING THE SAME

The present application is based on Japanese Patent Applications No. 2002-183730, 2002-326194, 2002-326195 and 2003-013398, which are incorporated herein by reference.

BACKGROUND OF THE INVENTION

1. Field of the Invention

The present invention relates to a method for producing a semiconductor element formed on a substrate. Particularly, the invention relates to a method for obtaining semiconductor elements with a good yield by individually dividing the semiconductor elements formed on a substrate in an easy way.

2. Description of the Related Art

In production of a Group III nitride compound semiconductor element such as an LED, sapphire, spine 1 or the like is used as a substrate material. Substrates made of these materials differ from substrates using silicon and gallium arsenide in that they are not easy to process. Accordingly, when a wafer obtained by lamination of Group III nitride compound semiconductors on a substrate made of one of these materials is divided into individual elements, the division is attended with difficulty compared with semiconductor elements made of other materials.

For example, semiconductor elements were produced as follows. Part of Group III nitride compound semiconductor layers on each parting line are removed by etching or separation grooves are formed in a front surface of a substrate by a diamond-bladed dicer so as to reach a depth of about 10 µm from the front surface of the substrate (so-called half cut). Then, after shallow rear grooves are formed in a rear surface of the substrate by a scriber, the wafer is divided into elements by means of roller-breaking. On this occasion, after the formation of elements, the rear surface of the wafer 300 µm thick may be often polished to reduce the thickness of the wafer to about 100 µm before the rear grooves are formed. As a result, during the division, the percentage of defective elements including elements broken so as to spoil the functions of the elements (element breaking) and elements having partially chipped circumferential edges so as not to be regarded as normal articles (chipping) often reaches about 5%. When the separation grooves 10 µm deep are formed in the substrate by a dicer, the width of each separation groove needs to be in a range of from 20 µm to 30 µm. Although failure caused by the way of breaking the substrate decreases as the depth of each separation groove from the front surface of the substrate increases, the width of each separation groove must be increased to obtain an increased depth. As the width of each separation groove increases, the number of semiconductor elements which can be extracted from one wafer decreases. Furthermore, the time and setting condition required for polishing the rear surface of the substrate must be changed, for example, according to the thickness of the wafer. This is very troublesome work requiring trial and error. On the other hand, there are various kinds of proposals to use a laser beam for forming such separation grooves. The proposals, however, have been not put into practical use yet in production of Group III nitride compound semiconductor elements.

When separation grooves are formed by laser beam irradiation, substrate and semiconductor materials are melted and vaporized so that element surfaces are contaminated with reaction products. To prevent the element surfaces from being contaminated with reaction products, a method of covering the element surfaces with a protective film before the formation of the separation grooves is feasible. Alternatively, another method of forming separation grooves not in a front surface as an element-forming surface but in a rear surface is conceivable. In the formed separation grooves per se, however, a part of the substrate melt and re-solidified remains on outer circumferences, that is, side surfaces of the elements. When light-emitting elements are formed on a transparent sapphire substrate, opaque deposits are formed on the outer circumferences (side surfaces) and rear surfaces of the elements. As a result, light-extracting efficiency of each of the light-emitting elements is reduced.

In addition, the molten semiconductor may form an undesirable short circuit to spoil element characteristic remarkably or a dividing method for producing a very small number of acceptable products may be provided according to circumstances.

The above examples will be explained based on the drawings in more detail.

First, referring to FIGS. 26A and 26B and FIGS. 27A to 27C, the general irradiation operation of a laser beam applied on a semiconductor wafer will be described. FIGS. 26A and 26B relate to a light-emitting diode (LED). When a laser beam is applied on a semiconductor wafer in order to divide the wafer into a large number of semiconductor chips, a substrate and semiconductor layers are melted by heat of the laser beam so that a molten layer is formed in a partition portion of the outer circumference of each semiconductor chip, for example, as shown in FIGS. 26A and 26B. Because the molten layer is not translucent so that light emitted from a light-emitting layer is absorbed to the molten layer, the molten layer is a a main cause of reduction in external quantum efficiency of the LED.

Furthermore, when each separation groove S is formed in the semiconductor wafer by laser beam irradiation in the procedure shown in FIGS. 27A to 27C, the semiconductor layers (p/n) and the substrate (Sap.) are melted, vaporized and scattered so as to be deposited on the upper surface of the exposed semiconductor layer. As a result, the upper surface of the semiconductor layer is contaminated. Such a contaminant (deposit) is also a main cause of reduction in external quantum efficiency of the semiconductor light-emitting element.

Because it was not easy to eliminate these causes (molten layer and deposit) of deterioration against improvement in external quantum efficiency of the semiconductor light-emitting element, a wafer dividing method using a dicing cutter or a scribing cutter was used heretofore usually.

FIG. 28 is a plan view of a semiconductor chip 21 which can be produced by the dividing method according to the related art. The semiconductor chip 21 is characterized in that an n-electrode (negative electrode) 5 having an outer circumferential negative electrode 5a is provided on an exposed upper surface of an n-layer 2 (n-type layer). The reference numeral 4 designates a p-layer (p-type layer); and 8, a positive electrode (or electrode pad). A translucent thin-film metal layer may be formed widely and evenly on the upper surface of the p-layer 4.

FIG. 29 is a plan view showing part of a related-art semiconductor wafer 20 having a large number of semiconductor chips 21 before division. From the point of view of production efficiency, a larger number of chips may be often arranged on one wafer practically. The reference sign L designates the distance between light-emitting layers of adjacent ones of the semiconductor chips 21 on the semiconductor wafer 20.

FIGS. 30A and 30B are sectional views showing part of the semiconductor wafer 20. The n-layer 2, the light-emitting layer 3 and the p-layer 4 are laminated successively on the crystal growth substrate 1 by crystal growth. It is a matter of course that each layer may be provided as a multilayer structure.

The reference sign $L_1$ designates the distance from a side wall of the light-emitting layer 3 to a light-reflecting surface of the outer circumferential negative electrode 5a. The distance $L_1$ needs to be at least long enough to surely electrically insulate the outer circumferential negative electrode 5a from other semiconductor layers such as the light-emitting layer 3 provided on the side. The distance $L_1$ also depends on accuracy in patterning of a metal layer for forming the outer circumferential negative electrode 5a.

The reference sign $L_2$ designates the width of the outer circumferential negative electrode 5a. The width $L_2$ is generally selected to be not smaller than about 10 μm in order to satisfy necessary conditions such as adhesive strength to then-layer 2, current density distribution, machining accuracy, and miniaturization.

The distance Δ between outer circumferential negative electrodes 5a of left and right chips on the semiconductor wafer 20 is given by the following expression (1).

[Numerical Expression 1]

$$\Delta = L - 2(L_1 + L_2) \quad (1)$$

Incidentally, FIG. 13B shows a state in which a separation groove S is formed between the outer circumferential negative electrodes 5a of the left and right chips by dicing.

Generally, before dicing, the metal layer is removed from the region indicated by the distance Δ. A scribing cutter or a dicing cutter is generally expensive because it is often made of a large number of diamond grains (pieces) gathered together. If the dicing process is executed without removal of the metal layer, the expensive cutter is clogged soon so that the cutter cannot be used any more. Therefore, in order to keep production efficiency and production cost, the metal layer in the region indicated by the distance Δ must not be formed initially or must be removed after formed.

It is therefore necessary to take the distance Δ sufficiently larger than the width of the separation groove S formed by the cutter. This is because there is a limit to shape accuracy of the cutter, positioning accuracy of the cutter, processing accuracy in removal of the metal layer, etc. This is inevitable to surely prevent the clogging of the cutter.

Generally, the width of the separation groove S formed by the cutter needs to be at least 30 μm. The clearance (distance) to be provided between the separation groove and the outer circumferential negative electrode 5a needs to be at least 5–10 μm. Accordingly, the distance Δ needs to be at least 40–50 μm.

Increase in the distance Δ, however, causes increase in the distance L between the light-emitting layers 3 of left and right chips adjacent to each other. As is also obvious from FIG. 29, increase in the distance L results in surely reducing the number of semiconductor chips 21 which can be extracted from the semiconductor wafer 20.

Furthermore, when the separation groove S is made deep, the width of the separation groove S is apt to increase inevitably. Conversely, when the separation groove S is made shallow, a crack 1d is apt to occur in the crystal growth substrate 1 in the step of dividing the wafer into chips as shown in FIG. 30B.

FIG. 31 is a sectional view of another semiconductor wafer for explaining another example of the related art. The width of the separation groove allowed to be formed by laser beam irradiation is about 10 μm. Although this width is surely smaller than the width (30 μm or larger) of the separation groove S formed by the cutter, the problem of deposit (contaminant) occurs secondarily when the laser beam irradiation step is introduced.

Even if the problem of deposit could be avoided, it is difficult to reduce the distance Δ greatly by the simple substitution of a laser for the cutter as a tool for forming the separation groove. That is, if the cutter as a tool for forming the separation groove is replaced by a laser simply, the value which can be expected as the effect of reducing the distance Δ is about 20 μm (=30 μm–10 μm) at most.

SUMMARY OF THE INVENTION

An object of the invention is to provide individual semiconductor elements obtained by dividing a substrate easily with a good yield and low cost and another object of the invention is to remove melt of a substrate from outer circumferences of elements after division as much as possible.

According to a first aspect of the invention, there is provided a method of producing a plurality of Group III nitride compound semiconductor elements by individually dividing the Group III nitride compound semiconductor elements formed on a substrate, the method comprising steps of: removing semiconductor layers on parting lines so that (i) only an electrode-forming layer on a side near the substrate remains or (ii) no Group III nitride compound semiconductor layers remains on the parting lines; forming a protective film so that the Group III nitride compound semiconductor layers are covered with the protective film and the protective film can be removed by an after-process; scanning the substrate with a laser beam along the parting lines to form separation grooves in a front surface of the substrate; and removing the protective film and unnecessary products produced by the laser beam scanning, wherein the separation grooves formed along the parting lines by the laser beam scanning are used for dividing the substrate into individual Group III nitride compound semiconductor elements.

In the method of the first aspect of the invention, the semiconductor layer removal step may be carried out in an electrode-forming etching process for exposing an electrode-forming portion of an electrode-forming layer on a side near the substrate by etching. Further, in the semiconductor layer removal step, electrode-forming layer side part of the substrate on the parting lines may be also removed by dicing.

In the method of the first aspect of the invention, rear grooves corresponding to the separation grooves may be formed in a rear surface of the substrate after the protective film and unnecessary product removal step. Further, a rear surface of the substrate may be polished to reduce the thickness of the substrate after the protective film and unnecessary product removal step so that the substrate can be divided into individual Group III nitride compound semiconductor elements by use of only the separation grooves formed in the front surface of the substrate. Still further, a rear surface of the substrate may be polished to reduce the thickness of the substrate after the protective film and unnecessary product removal step and rear grooves corresponding to the parting lines may be then formed in a rear surface of the substrate.

Because Group III nitride compound semiconductor layers on the parting lines are removed so that only an electrode-forming layer on a side near the substrate remains or no Group III nitride compound semiconductor layer remains on the parting lines, layers which must be brought into contact with different electrodes respectively can be prevented from being short-circuited by melt or reaction products produced from the Group III nitride compound semiconductor layers by laser scanning. Furthermore, because a protective film is formed, melt or reaction products produced from the substrate and the Group III nitride compound semiconductor layers by laser scanning can be prevented from being deposited on semiconductor elements. Particularly layers which must be brought into contact with electrodes different in polarity respectively can be prevented from being short-circuited. In this manner, deep separation grooves with a constant small width can be formed without failure in electric characteristic of each Group III nitride compound semiconductor element. That is, the depth of each separation groove can be adjusted on the basis of the scanning speed and the number of scanning times, so that the separation grooves can be easily formed as deep separation grooves with a constant width or as separation grooves with a depth according to the thickness of the wafer and the warp of the wafer. Further, during the formation of the deep separation grooves, the Group III nitride compound semiconductor layers and the substrate are not peeled. The blade and pure water which are expendables required for forming separation grooves with a certain depth can be reduced, so that the cost of production can be reduced. At present, a laser with a beam diameter of 20 μm or less is available. Accordingly, the width of each separation groove formed by laser scanning can be made smaller than the width of each separation groove formed by dicing on the assumption that the depth of the separation groove formed is constant. For example, in light-emitting elements, the interval between adjacent light-emitting surfaces can be made not larger than 60 μm.

When an electrode-forming etching process for exposing an electrode-forming portion of an electrode-forming layer on a side near the substrate by etching is used for removing other electrode layers on the parting lines before the formation of the separation grooves, the working steps can be shortened because the semiconductor layer removal step for preventing different layers from being short-circuited by laser scanning need not be provided separately. When dicing is further used so that at least electrode-forming layer side part of the substrate is removed, the surface layers of the substrate can be cut down to a desired depth according to the setting of the condition.

When rear grooves are formed in the rear surface of the substrate so as to correspond to the separation grooves, parting surfaces can be formed surely along the parting lines. When the rear surface of the substrate is polished to reduce the thickness of the substrate, the substrate can be easily divided into individual Group III nitride compound semiconductor elements by use of only the separation grooves formed in the front surface of the substrate. When these methods are combined so that rear grooves are formed in the rear surface of the substrate so as to correspond to the formed separation grooves after the rear surface of the substrate is polished to reduce the thickness of the substrate, the separation grooves formed in the front surface of the substrate by laser scanning can be made shallow and the speed of laser scanning can be made high as well as the substrate can be more surely divided into individual Group III nitride compound semiconductor elements.

According to a second aspect of the invention, there is provided a method of producing a plurality of Group III nitride compound semiconductor light-emitting elements by individually dividing Group III nitride compound semiconductor elements formed on a substrate, the method comprising the step of performing a polishing or blasting process with respect to separation grooves after forming separation grooves by laser beam irradiation. Hereupon, "blasting process" means a process of blowing fine particles on the subject to be processed with high pressure to polish the surface of the subject.

In the method of the second aspect of the invention, the separation grooves may be formed in a rear surface of the substrate opposite to a front surface of the substrate on which Group III nitride compound semiconductor layers and electrodes are formed, and the polishing or blasting process may be applied to the rear surface. Further, when the blasting process is used, particles used in the blasting process may be selected so that a medium value of diameters of the particles is equal to about a half width of each separation groove. Still further, the substrate may be a sapphire substrate. Furthermore, when the blasting process is used, particles used in the blasting process may be mainly of alumina or silicon carbide.

The inventors have confirmed that re-solidified melt of a substrate can be removed greatly without spoiling the characteristic of Group III nitride compound semiconductor light-emitting elements after division when the condition for a polishing or blasting process is selected appropriately as follows. That is, when a polishing or blasting process is carried out after separation grooves are formed by laser beam irradiation, it is possible to obtain Group III nitride compound semiconductor light-emitting elements from which opaque melt of the substrate has been already removed after division. Furthermore, because expensive expendables (cutting tools) required in use of a dicer or a scriber can be dispersed with, the cost of production can be reduced.

When both the formation of separation grooves by laser beam irradiation and the polishing or blasting process are applied not to the front surface side on which elements are formed but to the rear surface side, the influence on the Group III nitride compound semiconductor layer for forming the elements can be suppressed. According to this method, very deep grooves can be formed in the rear surface, so that the wafer can be divided on the basis of separation grooves substantially formed only by laser beam irradiation without use of a dicer and a scriber. Furthermore, the rear surface of the substrate is cut by the polishing or blasting process, so that bumps with a size substantially equal to the size of blast particles are formed on the rear surface of the substrate. Light emitted from each element can be irregularly reflected by the bumps in the bottom of the chip, so that light-extracting efficiency of the element can be improved.

Each of the separation grooves formed by laser beam irradiation is provided with solidified melt having a size substantially equal to the size of the separation groove. It is therefore necessary to select the size of particles used in the blasting process in order to blow out the melt of this size. Accordingly, particles used in the blasting process are preferably selected so that a medium value of diameters of the particles is equal to about a half width of each separation groove. When a sapphire substrate is used as the substrate, it is possible to obtain Group III nitride compound semiconductor light-emitting elements in which efficiency in extraction of light from the rear surface is improved when each element is applied to a flip chip type light-emitting element. Preferably, the particles may be of a compound which has not any other undesirable influence, that is, the particles may be mainly of alumina or silicon carbide.

According to a third aspect of the invention, there is provided a method of producing a plurality of Group III nitride compound semiconductor elements by individually dividing the Group III nitride compound semiconductor elements formed on a substrate, the method comprising steps of: removing Group III nitride compound semiconductor layers on parting lines so that (i) only an electrode-forming layer on a side near to the substrate remains on the parting lines or (ii) there is no Group III nitride compound semiconductor layer on the parting lines; and scanning the substrate along the parting lines with a laser beam to thereby form broken line-shaped or dot line-shaped separation grooves, wherein the broken line-shaped or dot line-shaped separation grooves formed by laser beam scanning along the parting lines are used so that the substrate is divided into individual Group III nitride compound semiconductor elements.

In the method of the second aspect of the invention, the semiconductor layer removal step may be carried out by an electrode-forming etching process for exposing an electrode-forming portion of the electrode-forming layer by etching. Further, in the semiconductor layer removal step, a part of the element-forming surface of the substrate on the parting lines may be also removed by dicing.

The method of the second aspect of the invention may further comprises steps of: forming a protective film so that layers formed on a front surface side of the substrate are covered with the protective film before the laser beam scanning step and the protective film can be removed by an after-process; and removing the protective film and unnecessary products produced due to laser beam scanning after the laser beam scanning step.

In the method of the second aspect of the invention, before the separation grooves are used for dividing the substrate into elements, rear grooves corresponding to the parting lines may be formed in a rear surface of the substrate. Further, before the separation grooves are used for dividing the substrate into elements, a rear surface of the substrate may be polished to reduce a thickness of the substrate so that the substrate can be divided into individual Group III nitride compound semiconductor elements only by the separation grooves formed in the front surface of the substrate. Still further, before the separation grooves are used for dividing the substrate into elements, a rear surface of the substrate may be polished to reduce a thickness of the substrate and then rear grooves corresponding to the parting lines are formed in the rear surface of the substrate.

Because each of the separation grooves formed by laser scanning is shaped like a broken line or a dot line, the percentage of the area occupied by a molten portion formed by laser beam irradiation can be reduced. As a result, in the production of the light-emitting element, the rate of the area of melt deposited on side surfaces of each element to the total area of the side surfaces is reduced compared with the case where continuous separation grooves are formed by laser scanning. Accordingly, light-extracting efficiency can be improved. On this occasion, the thickness of part of the substrate between adjacent separation grooves on each parting line is left as it is. Accordingly, the rigidity of the wafer as a whole can be kept, so that the easy handling property of the wafer can be maintained. Accordingly, it is easy to deepen the separation grooves, so that easy processing property for dividing the wafer into individual elements can be made consistent with the easy handling property of the wafer. Further, because Group III nitride compound semiconductor layers on parting lines can be removed so that only an electrode-forming layer on a side near to the substrate remains on the parting lines or there is no Group III nitride compound semiconductor layer on the parting lines, layers which must be brought into contact with different electrodes respectively can be prevented from being short-circuited by melt and reaction products of the Group III nitride compound semiconductor layers due to laser scanning.

When an electrode-forming etching process for exposing an electrode-forming portion of an electrode-forming layer near the substrate by etching is carried out before the formation of the separation grooves so that other electrode layers on the parting lines are removed, the working steps can be shortened because it is particularly unnecessary to provide the semiconductor layer removal step for preventing the different layers from being short-circuited by the melt generated due to laser scanning. When at least a part of the element-forming surface of the substrate on the parting lines is also removed by dicing, the front surface layer of the substrate can be cut down to a desired depth according to the setting of the condition.

When a protective film is formed, the melt and reaction products generated from the substrate and the Group III nitride compound semiconductor layers due to laser scanning can be prevented from being deposited on each semiconductor element. Particularly layers which must be brought into contact with electrodes different in polarity respectively can be prevented from being short-circuited. In this manner, deep separation grooves with a constant small width can be formed without any failure in the electric characteristic of each Group III nitride compound semiconductor element. That is, the depth of each separation groove can be adjusted on the basis of the scanning speed and the number of scanning times, so that the separation grooves can be easily formed as deep separation grooves with a constant width or as separation grooves with a depth according to the thickness of the wafer and the warp of the wafer. Further, during the formation of the deep separation grooves, the Group III nitride compound semiconductor layers and the substrate are not peeled. The blade and pure water which are expendables required for forming separation grooves with a certain depth can be reduced, so that the cost of production can be reduced. At present, a laser with a beam diameter of 20 μm or less is available. Accordingly, the width of each separation groove formed by laser scanning can be made smaller than the width of each separation groove formed by dicing on the assumption that the depth of the separation groove is constant. For example, in light-emitting elements, the interval between adjacent light-emitting surfaces can be made not larger than 60 μm.

When rear grooves are formed in the rear surface of the substrate so as to correspond to the parting lines, parting surfaces can be formed surely along the parting lines. When the rear surface of the substrate is polished so that the thickness of the substrate is reduced, the substrate can be easily divided into individual Group III nitride compound semiconductor elements by use of only the separation grooves formed in the front surface of the substrate. When these methods are combined so that rear grooves are formed in the rear surface of the substrate to correspond to the parting lines after the rear surface of the substrate is polished to reduce the thickness of the substrate, the separation grooves formed in the front surface of the substrate by laser scanning can be made shallow and the speed of laser scanning can be made high as well as the substrate can be more surely divided into individual Group III nitride compound semiconductor elements.

According to a fourth aspect of the invention, there is provided a method of producing a plurality of semiconductor light-emitting elements by extracting the plurality of light-emitting elements from a semiconductor wafer formed by lamination of a plurality of nitride compound semiconductor layers on a crystal growth substrate, the method including the step of applying a laser beam on a metal layer formed on the semiconductor wafer and serving as a negative electrode of each of the semiconductor light-emitting elements to thereby form continuous line-shaped, dot line-shaped, broken line-shaped or cross-shaped separation grooves for separating the semiconductor wafer into the plurality of semiconductor light-emitting elements.

According to this method, the number of semiconductor chips each of which has performance equal to or higher than the performance of a semiconductor chip obtained in the related art and which can be extracted from one semiconductor wafer having a predetermined area can be made larger than that in the related art.

FIG. 18 is a plan view of a semiconductor wafer 10 according to the invention. FIGS. 19A and 19B are sectional views showing part of the semiconductor wafer 10. The reference numeral 50 designates a metal layer formed on an exposed surface of an n-layer 2 (n-type layer) by vapor deposition. The reference sign L designates the distance between light-emitting layers of adjacent semiconductor chips on the semiconductor wafer 10 as described preliminarily.

When, for example, a laser beam is applied on the metal layer 50 in the condition that the metal layer 50 is formed directly and evenly on the region of the distance Δ in the aforementioned manner, the distance Δ can be approximately reduced to a value equal to the width (about 10 μm) of the separation groove S allowed to be formed by laser beam irradiation. Accordingly, as is also obvious from the aforementioned consideration and the expression (1), the distance L in FIG. 29 can be reduced by at least a value of about 30 μm to about 40 μm as shown in FIGS. 18, 19A and 19B, on the basis of the separation groove S reducing effect according to this method.

Furthermore, according to this method, bonding strength between the metal layer (n-electrode) 50 and the semiconductor layer (n-layer 2) can be enhanced because a molten layer or an annealing portion due to laser beam irradiation is formed at a junction portion between the metal layer 50 and the semiconductor layer. Accordingly, there can be obtained a secondary effect that the durability and life of each semiconductor light-emitting element can be improved.

Furthermore, when an outer circumferential negative electrode 5a is formed from the metal layer 50 as shown in FIGS. 19A and 19B, there is no fear that the molten layer may be formed around the light-emitting layer 3 because the molten layer is obstructed by the metal layer 50. Accordingly, there is no fear that light emitted from the light-emitting layer 3 may be absorbed to the molten layer on a side of the light-emitting layer 3.

The method according to the fourth aspect may further include the step of laminating the metal layer on an approximately entire outer circumference of each of the semiconductor light-emitting elements before division so that the metal layer is circled over the approximately entire outer circumference of each of the semiconductor light-emitting elements, and in the laser beam applying step, the separation grooves are formed so that each of the separation grooves is circled over the approximately entire outer circumference of each of the semiconductor light-emitting elements.

In this manner, the fear that light emitted from the light-emitting layer 3 may be absorbed to the molten layer on a side of the light-emitting layer 3 is eliminated throughout the circumference of each semiconductor chip. This method is particularly effective for the light-emitting element having an outer circumferential electrode. In this case, the effect of reducing the chip width and the secondary effect of enhancing bonding strength between the metal layer (n-electrode) and the semiconductor layer can be obtained throughout the circumference of each chip.

The method according to the fourth aspect may further include the steps of: forming a protection film for covering a front surface of the semiconductor wafer before the laser beam applying step; and removing the protective film after the laser beam applying step.

According to this method, the contaminant can be prevented from being deposited on a front surface of the semiconductor wafer. Accordingly, transmission efficiency of light from the upper surface of each semiconductor chip can be kept equal to that of each semiconductor chip obtained by dividing the semiconductor wafer by a cutter.

The method according to the fourth aspect may further include the step of polishing a rear surface of the crystal growth substrate to make the crystal growth substrate thin.

When the step is provided, the wafer can be divided into chips unforcedly cleanly along the separation grooves between the chips even in the case where the separation grooves are relatively sallow. In addition, the substrate can be prevented from cracking.

Furthermore, when the substrate is made thin, transmission efficiency of output light with respect to the substrate is improved. Accordingly, external quantum efficiency is improved regardless of whether the light-emitting element to be formed is a flip chip type light-emitting element or a wire-bonding type light-emitting element having a reflecting layer on the substrate bottom.

The method according to the fourth aspect may further include the step of forming parting lines in the crystal growth substrate from the rear surface of the crystal growth substrate so that the parting lines face the separation grooves respectively.

When the step is provided, the wafer can be divided into chips unforcedly cleanly along the separation grooves between the chips even in the case where the separation grooves are relatively sallow. In addition, the substrate can be prevented from cracking.

Further, there is provided a semiconductor light-emitting element extracted from a semiconductor wafer formed by lamination of a plurality of nitride compound semiconductor layers on a crystal growth substrate, wherein the semiconductor light-emitting element is produced by a method according to the method of the fourth aspect and methods related thereto.

According to this means, bonding strength between the metal layer forming an electrode and the semiconductor layer can be enhanced because a molten layer or an annealing portion (e.g., heat-affected portion in FIG. 27C) for supplementing/reinforcing connection strength between the metal layer and the compound semiconductor layer is formed at a junction portion between the metal layer and the compound semiconductor layer. Accordingly, the durability of each semiconductor light-emitting element can be improved.

An outer circumferential negative electrode having an enclosure shape for enclosing a light-emitting portion at least partially from the outside may be provided in a wire-bonding type semiconductor light-emitting element.

In this manner, the fear that light emitted from the light-emitting layer 3 may be absorbed to the molten layer on a side of the light-emitting layer 3 is eliminated throughout the circumference of each semiconductor chip. This method is particularly effective for the light-emitting element having an outer circumferential electrode. In this case, the effect of reducing the chip width and the secondary effect of enhancing bonding strength between the metal layer (n-electrode) and the semiconductor layer can be obtained throughout the circumference of each chip.

An outer circumferential negative electrode having an enclosure shape for enclosing a light-emitting portion at least partially from the outside may be provided in a flip chip type semiconductor light-emitting element having a translucent substrate and formed by the above method.

In this manner, the fear that light emitted from the light-emitting layer 3 may be absorbed to the molten layer on a side of the light-emitting layer 3 is eliminated throughout the circumference of each semiconductor chip. This method is particularly effective for the light-emitting element having an outer circumferential electrode. In this case, the effect of reducing the chip width and the secondary effect of enhancing bonding strength between the metal layer (n-electrode) and the semiconductor layer can be obtained throughout the circumference of each chip.

Furthermore, in the flip chip type semiconductor light-emitting element having a translucent substrate, there is some case where external quantum efficiency can be kept sufficient without necessity of newly providing the protective film formation step and the protective film removal step as will be described later in the seventh embodiment.

The outer circumferential negative electrode on the basis of the seventh or eighth means may be formed to have a height at least equal to a height of a light-emitting layer on a side of at least one side wall of the light-emitting layer.

According to this configuration, a part of light output from the side wall of the light-emitting layer may be reflected efficiently, for example, as shown in FIG. 22, so that external quantum efficiency may be improved.

According to tenth means of the invention, at least one part of the outer circumferential negative electrode as in the ninth means is formed on the side wall through an electrically insulating film.

The distance $L_1$ from a side wall of the light-emitting layer 3 to a light-reflecting surface of the outer circumferential negative electrode 5a, for example, as shown in FIG. 30A, may be reduced while electrical insulation of the metal layer from other semiconductor layers such as the light-emitting layer 3 provided on the side is maintained or ensured.

Further, in the case of a flip chip type semiconductor chip (seventh embodiment) shown in FIGS. 23A and 23B, the electrically insulating film may be very useful when an outer circumferential negative electrode (230) serving also as a reflecting layer is formed in a wide range for the purpose of improving reflecting efficiency.

Incidentally, the semiconductor light-emitting element maybe a surface emission type LD or maybe an end surface emission type LD. An embodiment related to the LD and the operation and effect of the LD will be described later specifically in an eighth embodiment of the invention. Further, although the above explanation are directed to a semiconductor light-emitting element using Group III nitride compound, the present invention can be applied to a method of producing general semiconductor elements other than Group III nitride compound semiconductor light-emitting elements.

As described above, the problem can be solved efficiently or reasonably by the means of the invention.

BRIEF DESCRIPTION OF THE DRAWINGS

In the accompanying drawings:

FIG. 18 is a plan view of a semiconductor wafer 10 according to a sixth embodiment of the invention;

FIGS. 27A to 27C are explanatory views for explaining the general function of a laser beam applied on a semiconductor wafer;

FIG. 29 is a plan view of a related-art semiconductor wafer 20 having a plurality of semiconductor chips 21 before division;

DETAILED DESCRIPTION OF THE PREFERRED EMBODIMENTS

Preferred embodiments of the invention will be described below with reference to the drawings. Incidentally, the invention is not limited to the following description of embodiments and an example. Although specific embodiments are provided, the invention can be applied to a general method for producing semiconductor elements, especially a general method for producing Group III nitride compound semiconductor elements.

[First Embodiment]

Figure 1A:
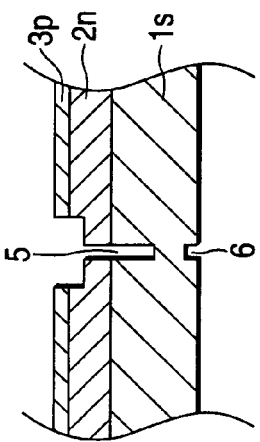
FIGS. 1A to 1G are step views (sectional views) for explaining a first embodiment of the invention.
Figure 1D:
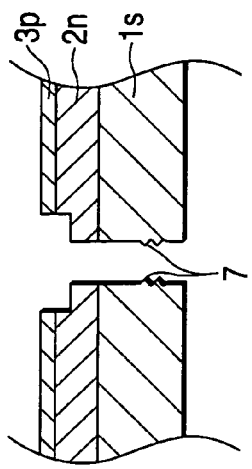
Figure 1F:
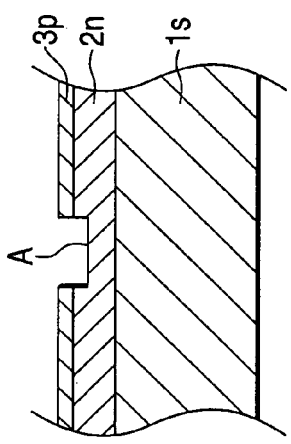
Figure 1B:
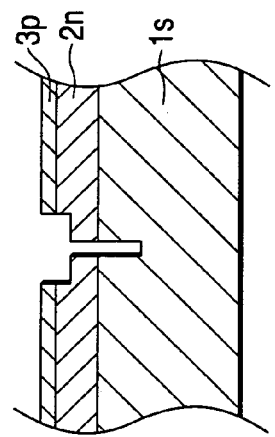

FIGS. 1A to 1G are step views (sectional views) for explaining a first embodiment of the invention. A plurality of Group III nitride compound semiconductor layers are formed on a substrate 1s for performing the formation of elements and the formation of electrodes. Although two Group III nitride compound semiconductor layers 2n and 3p are shown representatively in each of FIGS. 1A to 1G, the two layers 2n and 3p mean layers which must not be short-circuited and do not mean the fact that only two Group III nitride compound semiconductor layers are provided. Then, a state in which only the electrode-forming layer on a side near the substrate is left is formed on each parting line by etching or dicing due to a dicer (FIG. 1A). That is, concave portions A are formed. Here, the term "parting lines" means latticed frame-shaped lines in the case where ideal parting surfaces (perpendicular to the substrate is surface) for dividing the substrate 1s into individual Group III nitride compound semiconductor elements are viewed from the front surface side or rear surface side of the substrate is. Although FIG. 1A shows the case where only the electrode-forming layer 2n on a side near the substrate is left, it is a matter of course that etching or dicing due to a dicer may be performed until the substrate 1s is exposed or part of the front surface of the substrate 1s is removed. Then, a protective film 4 is formed on the whole front surface to prevent part of the substrate is melted or reacted by laser beam irradiation from being deposited on each element (FIG. 1B). Any film may be used as the protective film 4 if the film can be removed by an after-process and has no bad influence on the characteristic of each semiconductor element as well as a portion of the film not irradiated with a laser beam is not easily melted at the time of the formation of the separation grooves 5 by laser scanning.

Figure 1E:
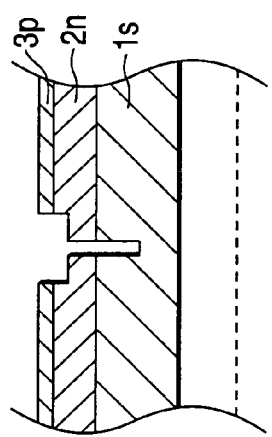
Figure 1G:
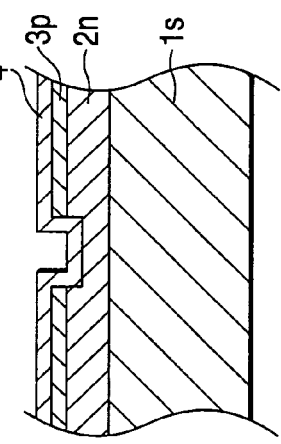
Figure 1C:
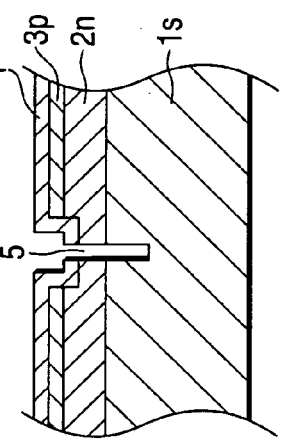

Then, separation grooves 5 are formed in the substrate is by laser scanning (FIG. 1C). The separation grooves 5 are formed like a latticed frame in the front surface side (element-forming side) of the substrate is along the latticed frame-shaped paring lines. Preferably, the depth of each separation groove 5 is selected to be not smaller than about ⅕ as large as the thickness of the thin-walled substrate is which will be polished by an after-process. Incidentally, when etching or dicing due to a dicer is performed until part of the substrate 1s is removed, the depth of each separation groove 5 as the sum of the thickness of the part of the substrate is removed by etching or dicing and the depth cut by laser scanning is preferably selected to be not smaller than about ⅕ as large as the thickness of the thin-walled substrate 1s which will be polished by an after-process. Then, the protective film 4 is removed together with reaction products produced by laser beam irradiation (FIG. 1D).

Then, the rear surface of the substrate 1s is polished to reduce the thickness of the substrate 1s (FIG. 1E). Then, rear grooves 6 are formed in the rear surface of the substrate 1s so as to be located in positions corresponding to the latticed frame-shaped parting lines (FIG. 1F). The method for forming the rear grooves 6 differs from the method for forming the separation grooves 5. That is, the rear grooves 6 may be formed as shallow grooves by a scriber or the like. Then, the substrate is divided into individual elements along the latticed frame-shaped parting lines by means of roller-breaking or the like. In this case, because the depth of each separation groove 5 is not smaller than about ⅕ as large as the thickness of the thin-walled substrate is, parting surfaces 7 can be surely formed as surfaces connecting the separation grooves 5 to the rear grooves 6 respectively along the latticed frame-shaped parting lines. That is, the substrate can be prevented from being broken in any undesirable direction such as an oblique direction (FIG. 1G).

[Second Embodiment]

Figure 2A:
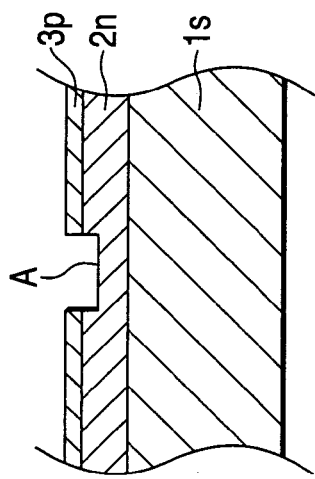
FIGS. 2A to 2F are step views (sectional views) for explaining a second embodiment of the invention.
Figure 2B:
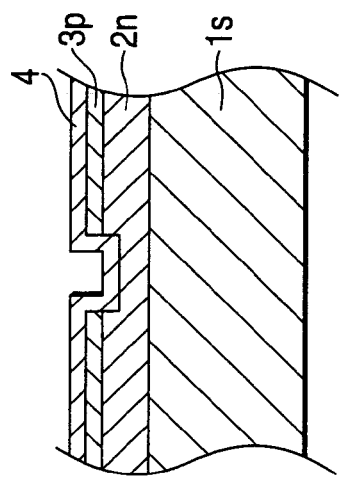
Figure 2C:
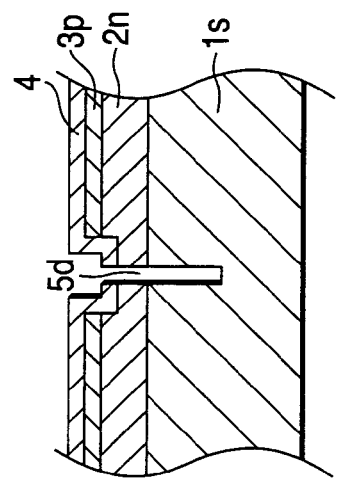
Figure 2D:
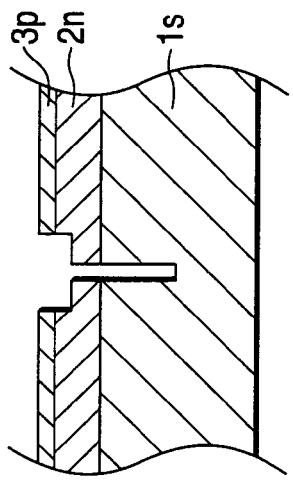

FIGS. 2A to 2F are step views (sectional views) for explaining a second embodiment of the invention. A state in which only the electrode-forming layer on a side near the substrate is left is formed on the parting lines by etching or dicing due to a dicer in the same manner as in the first embodiment shown in FIGS. 1A to 1G (FIG. 2A) In this case, it is a matter of course that etching or dicing due to a dicer may be performed until the substrate 1s is exposed or part of the front surface of the substrate 1s is removed. Then, a protective film 4 which can be removed by an after-process is formed on the whole front surface (FIG. 2B). Then, in this embodiment, first grooves 5d with a depth of not smaller than about ⅕ as large as the thickness of the substrate is are formed like a latticed frame in the front surface side (element-forming side) of the substrate 1s along the latticed frame-shaped parting lines (FIG. 2C). Then, the protective film 4 is removed together with reaction products produced by laser beam irradiation (FIG. 2D).

Figure 2E:
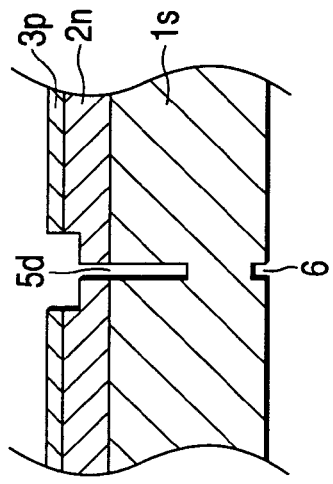
Figure 2F:
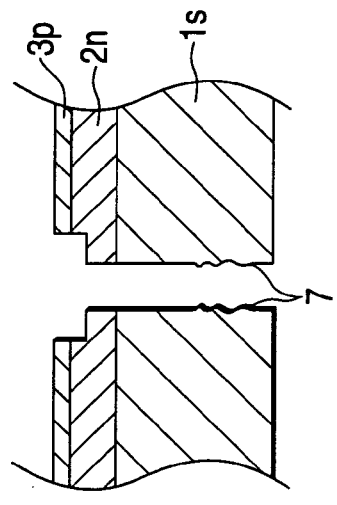

Then, rear grooves 6 are formed in the rear surface of the substrate is so as to correspond to the latticed frame-shaped parting lines (FIG. 2E). As the method for forming the rear grooves 6, shallow grooves may be formed by a scriber or the like in the same manner as in the first embodiment. Then, the substrate is divided into individual elements along the latticed frame-shaped parting lines by means of roller-breaking or the like. Because the depth of each separation groove 5d is not smaller than about ⅕ as large as the thickness of the substrate is, parting surfaces 7 can be surely formed as surfaces connecting the separation grooves 5d to the rear grooves 6 respectively along the latticed frame-shaped parting lines (FIG. 2F).

[Third Embodiment]

Figure 3A:
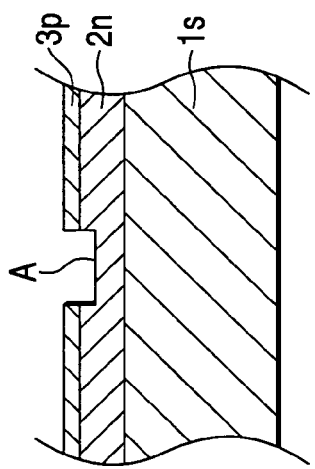
FIGS. 3A to 3F are step views (sectional views) for explaining a third embodiment of the invention.
Figure 3B:
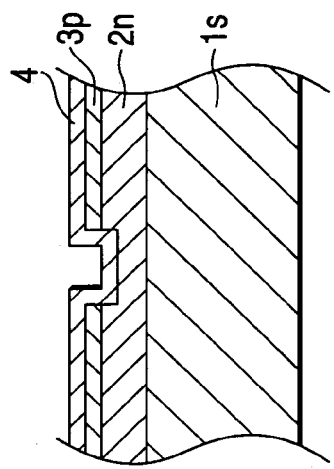
Figure 3C:
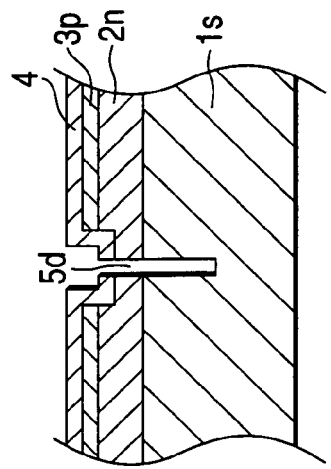
Figure 3D:
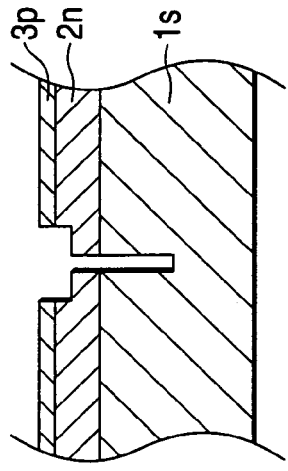

FIGS. 3A to 3F are step views (sectional views) for explaining a third embodiment of the invention. A state in which only the electrode-forming layer on a side near the substrate is left is formed on the parting lines by etching or dicing due to a dicer in the same manner as in the second embodiment shown in FIGS. 2A to 2F (FIG. 3A). In this case, it is a matter of course that etching or dicing due to a dicer may be performed until the substrate 1s is exposed or part of the front surface of the substrate 1s is removed. Then, a protective film 4 which can be removed by an after-process is formed on the whole front surface (FIG. 3B). Then, first grooves 5d with a depth not smaller than the thickness of the thin-walled substrate 1s which will be polished by an after-process are formed like a latticed frame in the front surface side (element-forming side) of the substrate 1s along the latticed frame-shaped parting lines (FIG. 3C). Then, the protective film 4 is removed together with reaction products produced by laser beam irradiation (FIG. 3D).

Figure 3E:
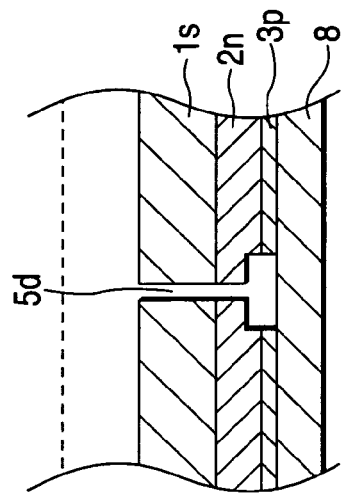
Figure 3F:
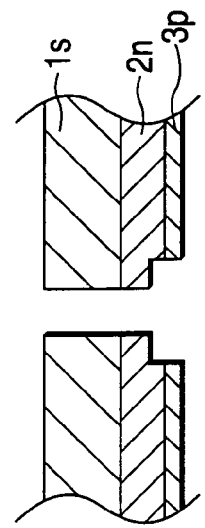
Figure 4A:
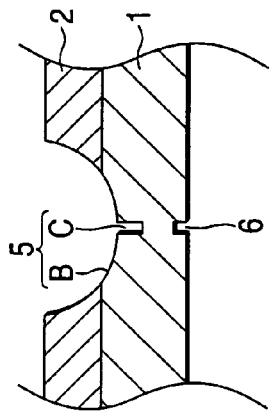
FIGS. 4A to 4G are step views (sectional views) for explaining a specific example of the invention.
Figure 4B:
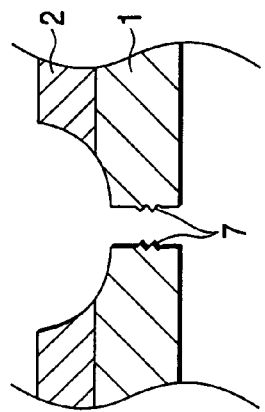
Figure 4C:
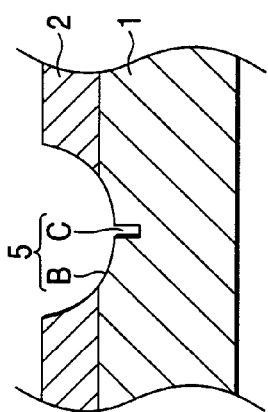
Figure 4D:
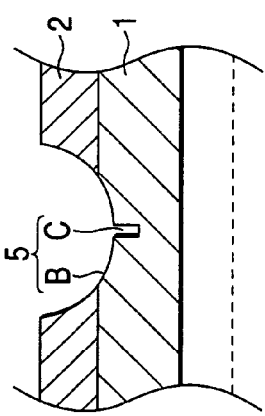
Figure 4E:
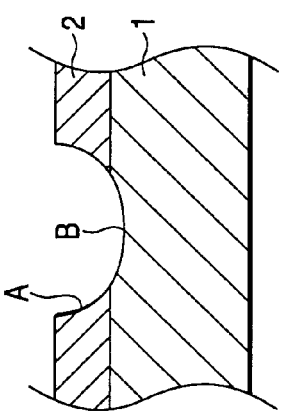
Figure 4F:
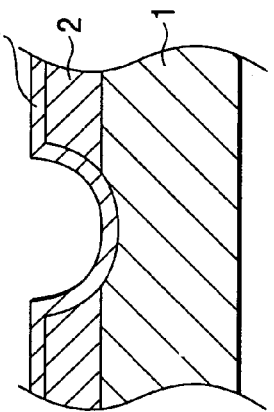
Figure 4G:
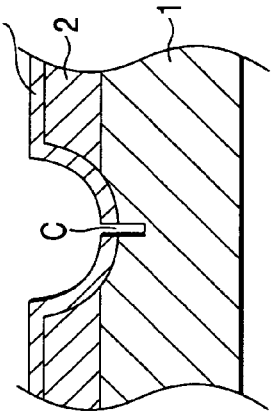

Then, a pressure-sensitive adhesive sheet 8 is stuck onto the whole front surface of the substrate 1s. After the substrate 1s is inverted, the rear surface of the substrate 1s is polished to reduce the thickness of the substrate 1s (FIG. 3E). When the thickness of the substrate 1s is reduced until each separation groove 5 passes through the substrate 1s, the substrate can be surely divided into individual elements by the separation grooves 5 along the latticed frame-shaped parting lines (FIG. 3F).

EXAMPLE

FIGS. 4A to 4G are step views (sectional views) for explaining a specific example of the invention for evaluating the yield due to breaking and chipping and the characteristic of each element. Group III nitride compound semiconductor layers were laminated on a sapphire substrate 1 about 300 μm thick so that about 3000 p-n double hetero-junction structure blue LED elements were formed. The laminated structure of the element portion is shown as one layer 2 for the sake of simplification. The total thickness of the Group III nitride compound semiconductor layer except electrodes was about 5 μm. First groove portions A with a maximum depth of 10 μm and a width of about 30 μm were formed along parting lines, which were shaped like a latticed frame having cells indicating blue LED elements respectively, by a diamond-bladed dicer. On this occasion, in each of the deepest portions B of the groove portions A, the sapphire substrate 1 was cut by about 5 μm.

Then, a transparent resin 4 was applied on the whole element-forming surface and cured. Then, the third harmonic (wavelength: 355 nm) of a YAG laser was used for applying a laser beam with a beam diameter of about 20 μm along parting lines to thereby form second groove portions C deeper by 10 μm than the first groove portions A. In this manner, separation grooves 5 as obtained by cutting the sapphire substrate 1 by about 15 μm were formed from the first and second groove portions A and C. Then, the rear surface of the substrate 1 was polished so that the thickness of the substrate 1 was reduced to 100 μm. Then, rear grooves 6 were formed in the rear surface of the sapphire substrate 1 by a scriber. Then, the sapphire substrate was divided into individual blue LED elements by means of roller-breaking. On this occasion, the number of shape-defective products (so-called broken or chipped elements) caused by the division of the sapphire substrate 1 was not larger than 10. The element characteristic of each light-emitting element was almost the same as that of each blue LED element extracted without use of any laser.

Comparative Example 1

The substrate was divided into elements in the same manner as in Example except that the front surface of the substrate was diced and the rear surface of the substrate was polished and scribed without use of any laser. In this case, the number of shape-defective products (so-called broken or chipped elements) was not smaller than 100.

Comparative Example 2

The substrate was divided into elements in the same manner as in Example except that the separation grooves were formed in the front surface of the substrate by only laser beam irradiation without dicing. In this case, the number of shape-defective products (so-called broken or chipped elements) was small desirably. In any case, a great deal of failure in element characteristic however occurred because the p-electrode side layer and the n-electrode side layer were short-circuited. The same effect was also obtained when the fundamental wave (1064 nm) of a YAG laser with a beam diameter of about 15 μm was used.

[Fourth Embodiment]

Figure 5C:
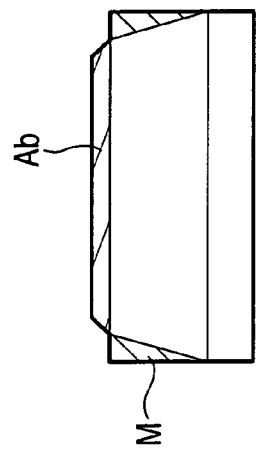
FIG. 5C is a sectional view showing the Group III nitride compound semiconductor element according to the related art.
Figure 5E:
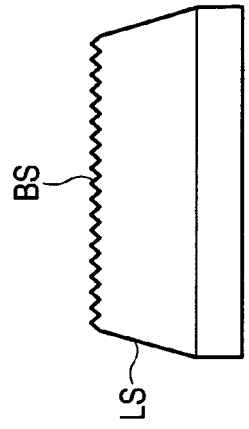
FIG. 5E is a sectional view showing the Group III nitride compound semiconductor element according to the invention.
Figure 5B:
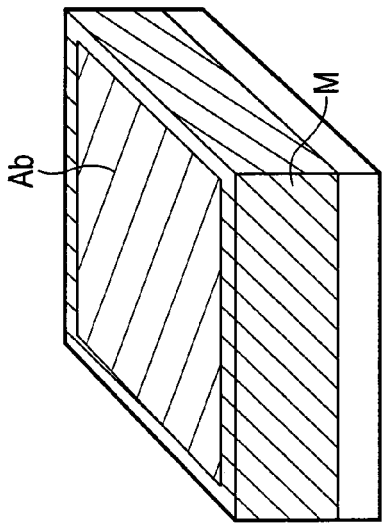
FIG. 5B is a perspective view showing a rear surface side of a Group III nitride compound semiconductor element according to the related art.
Figure 5D:
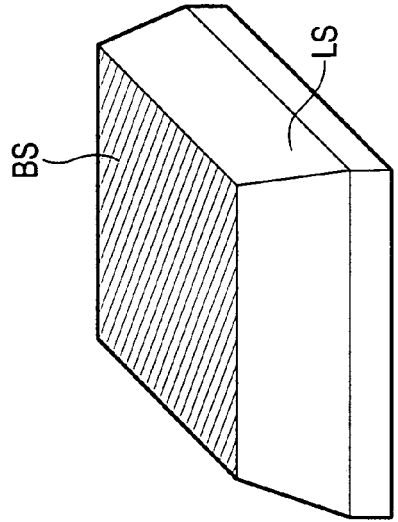
FIG. 5D is a perspective view showing a rear surface side of a Group III nitride compound semiconductor element according to the invention.
Figure 5A:
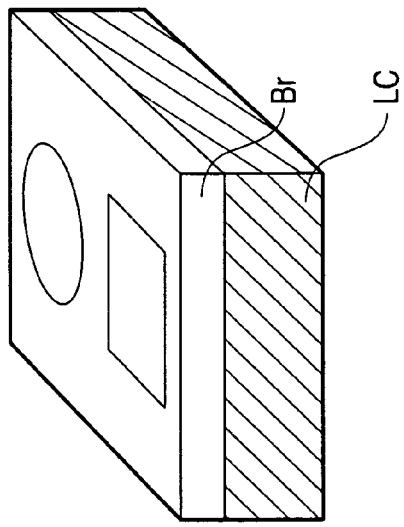
FIG. 5A is a perspective view showing an element-forming side of a Group III nitride compound semiconductor element.

FIGS. 5A to 5E are explanatory views showing the outline of the invention. FIG. 5A is a perspective view showing a Group III nitride compound semiconductor light-emitting element. In outer circumferential side surfaces of the element, the portion LC is a side surface of each separation groove formed by laser beam irradiation, and the portion Br is a substrate parting surface generated by a crack generated from the separation groove.

When a Group III nitride compound semiconductor light-emitting element formed on a front surface of a substrate and provided with separation grooves formed in a rear surface of the substrate by laser beam irradiation is divided simply by means of roller-breaking, re-solidified melt M of the substrate produced by laser beam irradiation is deposited on side surfaces of the separation grooves while vaporized (sublimed) re-solidified melt or scattered re-solidified melt Ab is deposited on the whole rear surface of the substrate as shown in FIG. 5B. Consequently, as shown in FIG. 5C which is a sectional view, the whole side surfaces of the separation grooves and the whole rear surface of the substrate are covered with the re-solidified melts M and Ab. Generally, these re-solidified melts M and Ab are opaque because they are amorphous. Accordingly, these re-solidified melts M and Ab make the light-extracting efficiency of the Group III nitride compound semiconductor light-emitting element worse. Therefore, in the invention, roller-breaking is performed after a polishing or blasting process. Accordingly, as shown in FIGS. 5D and 5E which are a perspective view and a sectional view, the re-solidified melt M is almost removed so that the side surfaces LS of the separation grooves can be exposed while the vaporized (sublimed) re-solidified melt or scattered re-solidified melt Ab is removed so that the rear surface of the substrate can be exposed as a bumpy surface BS. In this manner, there can be easily formed a Group III nitride compound semiconductor light-emitting element having a bumpy rear surface in the condition that the outer circumferential portion and the rear surface thereof are little covered with opaque re-solidified melt M and vaporized (sublimed) re-solidified melt or scattered re-solidified melt Ab.

Figure 6A:
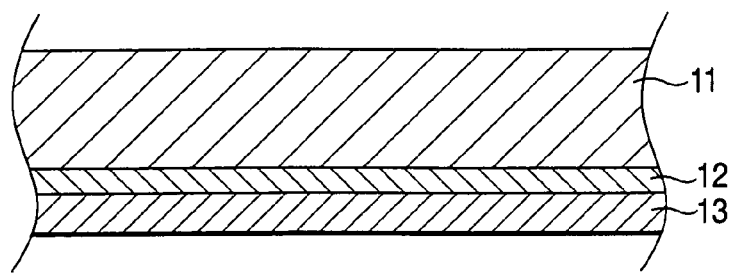
FIGS. 6A to 6C are step views showing a method for producing Group III nitride compound semiconductor elements according to a specific embodiment of the invention.
Figure 6B:
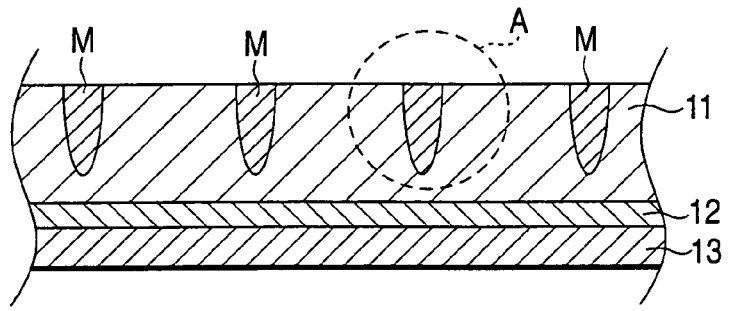
Figure 6C:
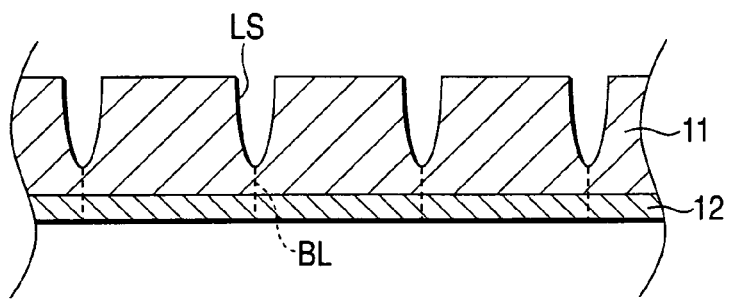

An embodiment of the invention will be described with reference to FIGS. 6A to 6F. FIGS. 6A to 6C are step views showing the embodiment of the invention. Necessary layers such as a Group III nitride compound semiconductor layer and an electrode layer are formed on a substrate 11. In FIGS. 6A to 6C, the necessary layers are represented by one Group III nitride compound semiconductor layer 12 for the sake of simplification. Then, a pressure-sensitive adhesive sheet 13 is stuck to a side on which the Group III nitride compound semiconductor layer 12 is formed. The wafer formed thus is inverted so that the rear surface of the substrate 11 faces upward (FIG. 6A). Then, the substrate may be polished to be made thin as occasion demands.

Figure 6D:
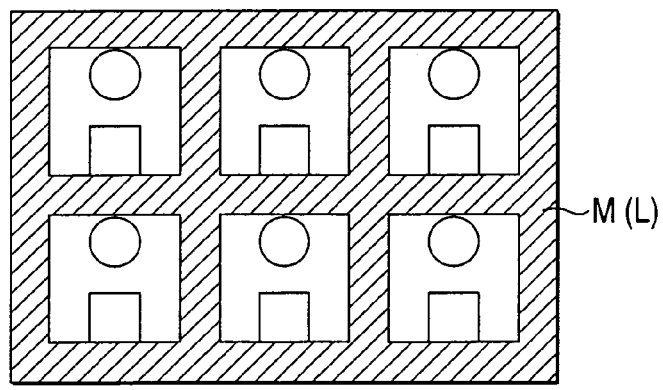
FIG. 6D is a view showing the formation of separation grooves.

Then, separation grooves shaped like a lattice are formed in the rear surface of the wafer by laser beam irradiation. For example, the separation grooves are shaped like a lattice as shown in FIG. 6D. In this manner, as shown in FIG. 6B, the separation grooves are formed in the condition that the separation grooves are filled with re-solidified melt M. Then, a polishing or blasting process is carried out to remove the re-solidified melt M from the separation grooves. Consequently, as shown in FIG. 6C, side surfaces LS of the separation grooves are exposed. Then, a crack BL is generated from each of the separation grooves by means of roller-breaking or the like to thereby divide the wafer into individual Group III nitride compound semiconductor light-emitting elements.

Figure 6E:
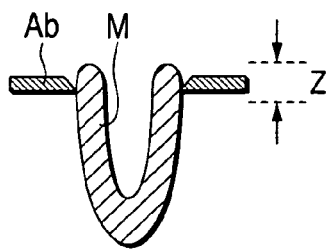
FIGS. 6E and 6F are detailed explanatory views showing a polishing or blasting process.
Figure 6F:
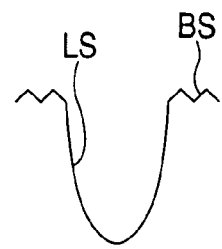

FIG. 6E is a detailed view showing a state of each separation groove before the polishing or blasting process. FIG. 6F is a detailed view showing a state of each separation groove after the polishing or blasting process. FIG. 6E is an enlarged view of the portion A depicted in FIG. 6B before the polishing or blasting process. Re-solidified melt M is deposited on the side surfaces of the separation grooves while vaporized (sublimed) re-solidified melt or scattered re-solidified melt Ab is deposited evenly on the rear surface of the substrate 11. Assume now that the re-solidified melt M is removed from the side surfaces of the separation grooves by the polishing or blasting process. In the case of the polishing process, it is a matter of course that the whole rear surface of the substrate is cut. In the case of the blasting process, blast particles also pound the rear surface of the substrate 1 because the size of a blast nozzle hole is larger than the width of each separation groove. As a result, a part of the rear surface of the substrate 11 is cut as well as the vaporized (sublimed) re-solidified melt or scattered re-solidified melt Ab is removed by the blast particles. In this manner, the region Z shown in FIG. 6E is subjected to the polishing or blasting process. Consequently, as shown in FIG. 6F, when the polishing or blasting process is carried out until the side surfaces LS of the separation grooves are exposed, the rear surface of the substrate can be exposed as a bumpy surface BS.

Although the following Example will be described upon the case where a sapphire substrate is used, the substrate used in the invention is not limited to the sapphire substrate. Examples of the substrate used in the invention include: inorganic crystal substrates such as sapphire, silicon (Si), silicon carbide (SiC), spine 1 ($MgAl_2O_4$), ZnO, MgO, etc.; Group III-Group V compound semiconductors such as gallium phosphide and gallium arsenide; and Group III nitride compound semiconductors such as gallium nitride (GaN), etc. In the following Example, a method for forming Group III nitride compound semiconductor layers will be not particularly described. Although a metal organic chemical vapor deposition or metal organic vapor phase epitaxy method (MOCVD or MOVPE) is preferably used as the forming method, a molecular beam epitaxy method (MBE), a halide vapor phase epitaxy method (Halide VPE), a liquid phase epitaxy method (LPE) or the like may be used. The respective layers may be formed by different epitaxy methods. When, for example, Group III nitride compound semiconductors are to be laminated on the sapphire substrate, it is preferable that a buffer layer is formed to correct lattice mismatch with the sapphire substrate to thereby form the Group III nitride compound semiconductors with good crystallinity. Although the formation of electrodes, etc. is not shown in each drawing for the sake of simplification to show only important part, it is a matter of course that the formation of electrodes and the shapes of respective portions can be selected optionally according to the design of the light-emitting elements.

Example and Comparative Example

A Group III nitride compound semiconductor layer 12 was laminated on a sapphire substrate 11 about 300 μm thick so that about 3000 p-n double hetero-junction structure blue LED elements were formed. A pressure-sensitive adhesive sheet was stuck to the element-forming surface side of the wafer. The rear surface of the wafer was mechanically polished so that the thickness of the wafer was reduced to a value of 90 μm to 150 μm. Then, the third harmonic (wavelength: 355 nm) of a YAG laser was used to apply a laser beam with a beam diameter of about 10 μm onto the rear surface of the wafer along parting lines. In this manner, separation grooves each having a width of 10 μm to 15 μm and a depth of 50 μm to 90 μm were formed in the rear surface of the wafer.

Then, alumina particles of 2000 mesh (median particle size: 7 μm) were used for performing a blasting process where the blasting process is carried out ten times along each separation groove under a blast nozzle pressure of 0.35 MPa. After the blasting process, the rear surface of the wafer was cleaned, dried and then divided by means of roller-breaking. The light-extracting characteristic of the blue LED elements obtained thus was improved compared with that of elements obtained by the related-art dividing method using a dicer or a scriber without any laser. The other element characteristics of the blue LED elements were substantially equal to those of elements obtained by the related-art dividing method. The yield due to the breaking and chipping in the dividing method according to the invention was also improved compared with that in the related-art dividing method using a dicer or a scriber.

Figure 7A:
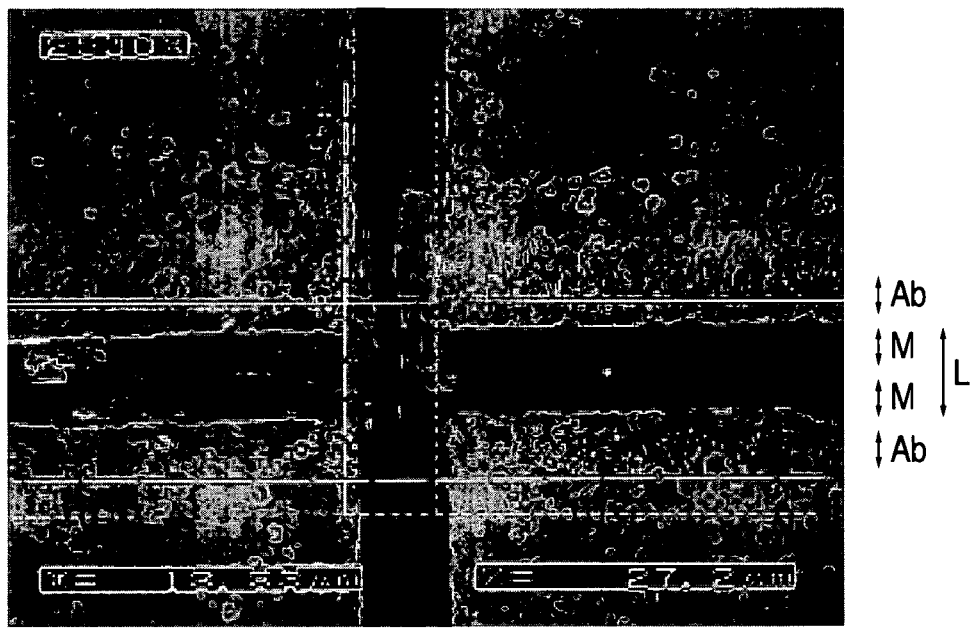
FIGS. 7A and 7B are photomicrographs of a wafer in a state in which laser-melt remains before the blasting process according to the invention.
Figure 7B:
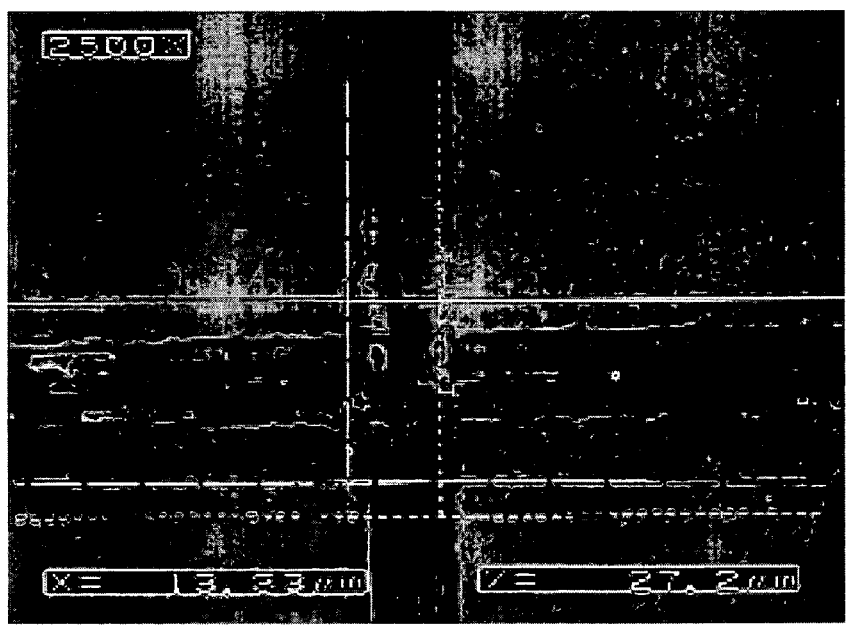

FIGS. 7A and 7B, FIGS. 8 and 9, and FIGS. 10A and 10B are photomicrographs showing results of execution of the invention. FIGS. 7A and 7B are photomicrographs of the rear surface of the wafer before the blasting process in the case where the separation grooves are formed by laser beam irradiation in the Example. FIGS. 7A and 7B show different positions of the wafer respectively. As shown in the right of FIG. 7A, the cross-like black belt portion indicates the separation grooves L. Narrow belt-like re-solidified melt M is observed in the inside of each separation groove L. Further, a portion containing a particularly large amount of vaporized (sublimed) re-solidified melt or scattered re-solidified melt Ab is observed around each separation groove L. The vaporized (sublimed) re-solidified melt or scattered re-solidified melt Ab is deposited on the whole rear surface of the wafer except the separation grooves L. In FIG. 7B vaporized (sublimed) re-solidified melt or scattered re-solidified melt Ab is deposited evenly around the separation grooves L so that granular vaporized (sublimed) re-solidified melt or scattered re-solidified melt Ab is inconspicuous.

Figure 8:
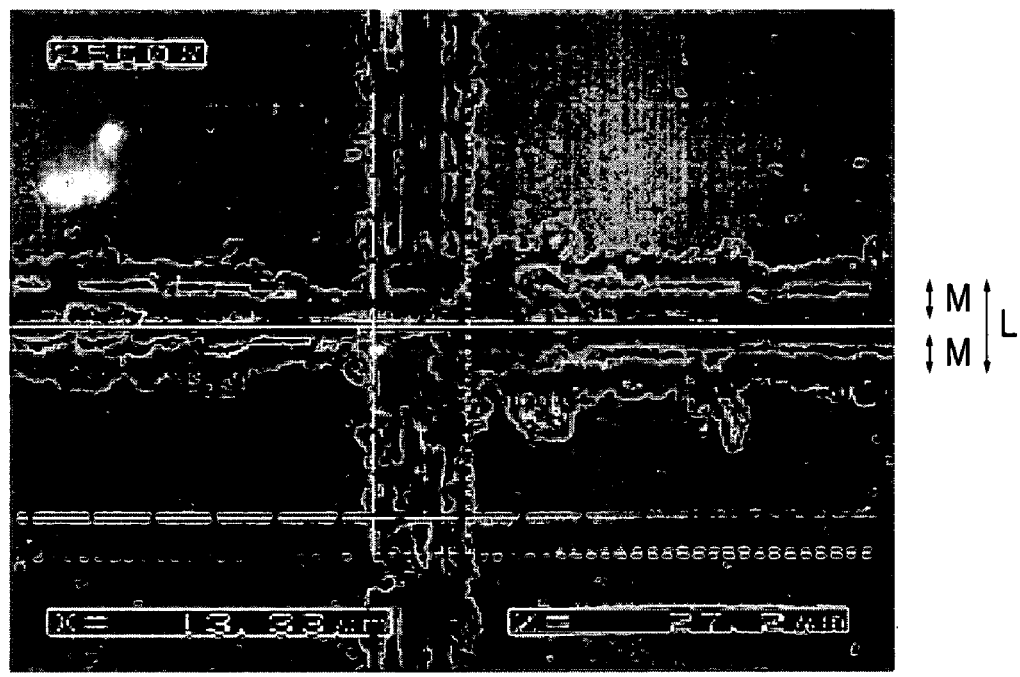
FIG. 8 is a photomicrograph of a wafer in a state in which laser-melt remains because the blasting process is performed insufficiently.
Figure 9:
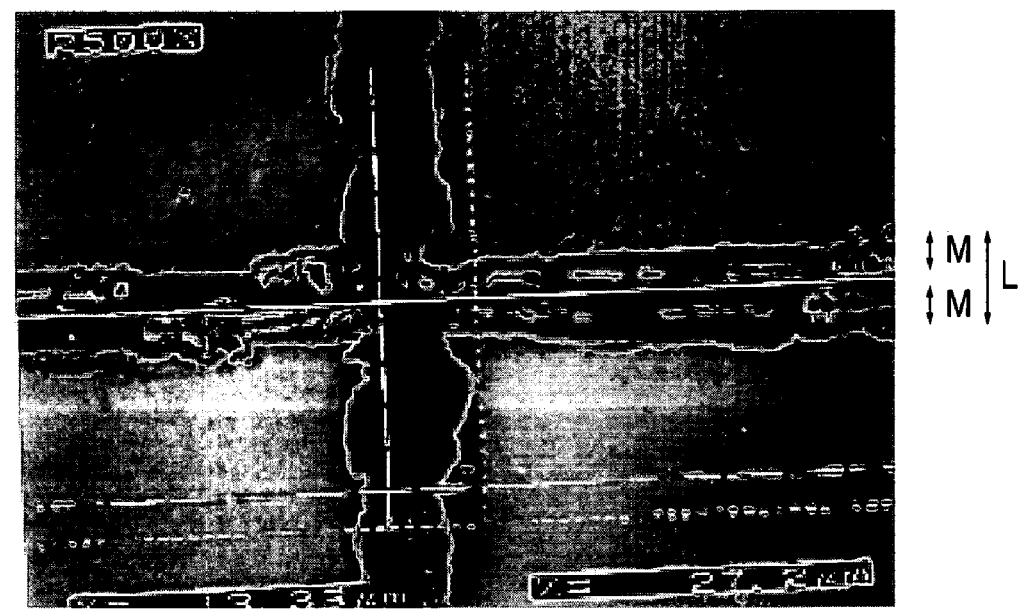
FIG. 9 is a photomicrograph of another wafer in a state in which laser-melt remains because the blasting process is performed insufficiently.

FIGS. 8 and 9 are photomicrographs of the wafer in the case where the blasting process is so insufficient that laser-melt remains. FIG. 8 shows the wafer in the case where the blasting process is carried out twice along each separation groove L under a blast nozzle pressure of 0.25 MPa. FIG. 9 shows the wafer in the case where the blasting process is carried out twice along each separation groove L under a blast nozzle pressure of 0.35 MPa. In each of FIGS. 8 and 9, it is obvious that re-solidified melt M remains in the inside of each separation groove L.

Figure 10A:
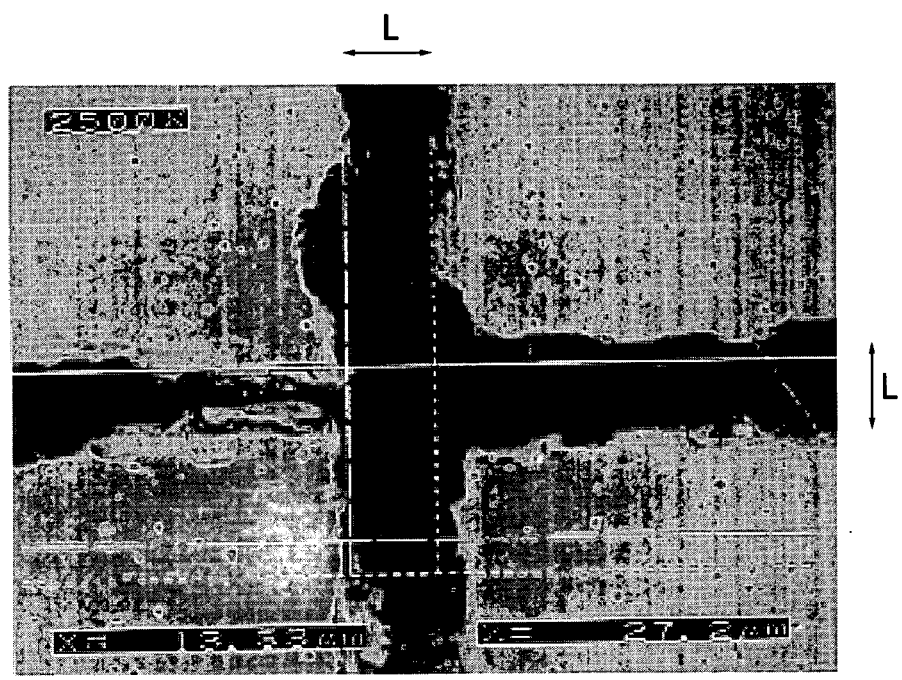
FIGS. 10A and 10B are photomicrographs of a wafer in a state in which laser-melt is almost removed by the blasting process according to the invention.
Figure 10B:
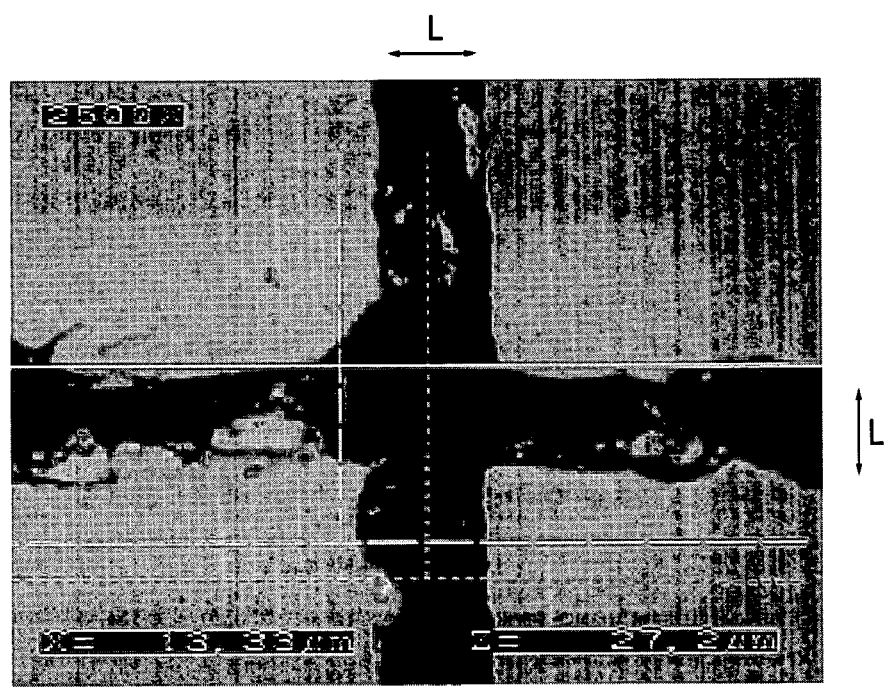

FIGS. 10A and 10B are photomicrographs of the wafer in the case where the blasting process is so sufficient that the laser-melt is-almost removed. FIGS. 10A and 10B show the case where the blasting process is carried out ten times along each separation groove L under a blast nozzle pressure of 0.35 MPa. Remaining of a slight amount of re-solidified melt M is observed but the re-solidified melt M is almost removed.

Although the Example has been described upon the case where the blasting process is carried out, the invention may be also achieved by mechanical polishing. In this case, the median particle size of polishing powder used in the polishing is preferably selected to be equal to about a half width of each-separation groove L. Opaque re-solidified melt M deposited on the side surfaces LS of the separation grooves L can be removed by the mechanical polishing. It is a matter of course that vaporized (sublimed) re-solidified melt or scattered re-solidified melt Ab deposited on the rear surface of the substrate can be also removed by the mechanical polishing.

[Fifth Embodiment]

Figure 11A:
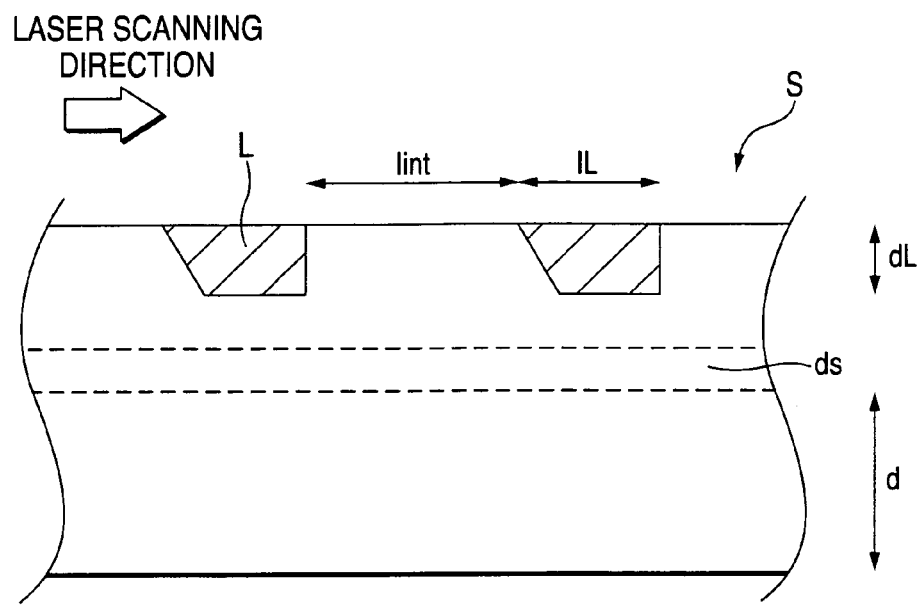
FIG. 11A is a typical view for explaining an embodiment of the invention.
Figure 11B:
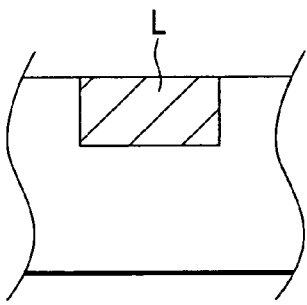
FIGS. 11B and 11C are typical views showing other examples of sections of separation grooves.
Figure 11C:
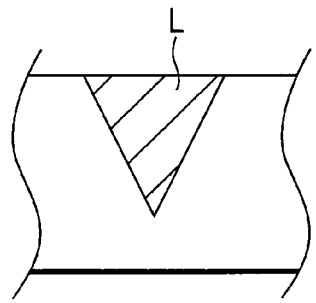

FIG. 11A is a typical view showing a section of a substrate S having broken line-shaped separation grooves L formed by laser scanning. The broken line-shaped separation grooves L each having a length $l_L$ are formed at intervals of $l_{int}$. Each of the broken line-shaped separation grooves L has a section shaped like a trapezoid. Such broken line-shaped separation grooves L are formed when the substrate S is moved at a constant speed while scanned with a laser beam along parting lines in the condition that the ratio of laser beam irradiation time to interrupt time is $l_L:l_{int}$. In FIG. 11A, the scanning direction of a laser relative to the substrate viewed from the substrate side, that is, in the case where the substrate is stopped, is expressed by an arrow. In the starting position of laser beam irradiation, the depth of the molten portion is small because the front surface portion of the substrate which has been not melted yet begins to be melted by a laser beam. On the other hand, the depth $d_L$ of the molten portion approaches a certain constant value on the basis of the laser beam irradiation condition (energy) and balance between the moving speed of the substrate and heat loss due to heat conduction. In this manner, the molten portion is formed continuously so that the depth of the molten portion takes an approximately constant value $d_L$. When laser beam irradiation is finally stopped, the depth of the molten portion at the stop position is $d_L$. In this manner, a laser molten portion having a trapezoidal section at each separation surface (plane containing a parting line and perpendicular to the wafer surface) is formed. The laser molten portion forms a broken line-shaped separation groove viewed from the wafer surface side. Incidentally, a section of each separation groove L parallel to the direction of laser beam irradiation is not limited to the trapezoidal section as shown in FIG. 11A. For example, the section of each separation groove L may be a rectangular section as shown in FIG. 11B or may be an acute-angled triangular section as shown in FIG. 11C. The section of each separation groove L can be formed optionally according to the setting of the laser scanning condition.

As described above, in an embodiment in which the ratio $l_L:l_{int}$ is in a range of from 1:6 to 3:4, the element characteristic is good. Although it is obvious that good characteristic can be obtained when the ratio is in a range of from 1:6 to 3:4, it may be conceived that a good result can be obtained when the ratio is in a range of from 1:8 to 1:1. Accordingly, it is preferable that laser scanning is performed in the condition that the ratio is in a range of from 1:8 to 1:1. Assuming that the wafer is divided into rectangular elements, then it is preferable that the number of separation grooves per one side of each element is not smaller than 1 as an average. The depth $d_L$ of each separation groove L is decided to a desired value according to the condition for a working process carried out later. When, for example, the rear surface of the substrate S is polished to reduce the thickness of the substrate S by a depth d from the rear surface of the substrate to thereby form ear grooves $d_s$, as shown in FIG. 11A, the depth $d_L$ of each separation groove L can be decided to a very small value.

Figure 11D:
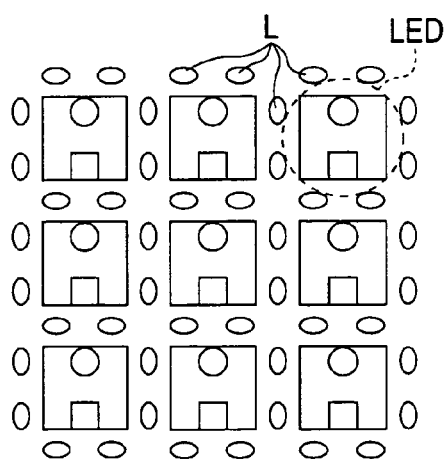
FIGS. 11D and 11E are typical views showing examples of formation of broken line-shaped separation grooves L.
Figure 11E:
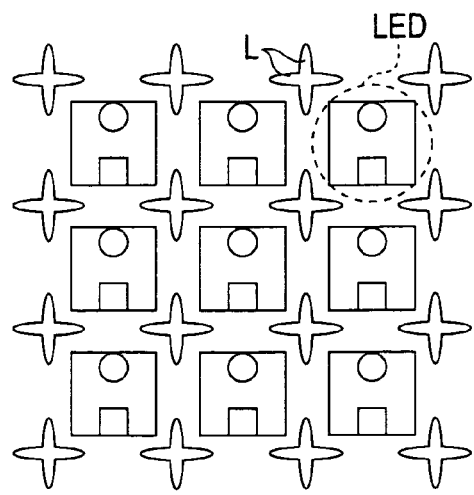

FIGS. 11D and 11E show examples of formation of broken line-shaped separation grooves. In each of FIGS. 11D and 11E, the portion encircled by the broken-like circle indicates an LED element simply. For example, the separation grooves L may be provided so that two separation grooves are formed on each of parting lines surrounding four sides of each LED element as shown in FIG. 11D. Or the separation grooves L may be provided so that two separation grooves crossing each other are formed in the vicinity of a point of intersection between two parting lines in accordance with each of four corners of each LED element as shown in FIG. 11E. Although each of FIGS. 11D and 11E shows the case where very accurate alignment is performed, it is a matter of course that the invention includes the case where the relation of separation grooves to each LED element is not based on such alignment. Assuming that two or more separation grooves are formed "roughly" on each of parting lines corresponding to four sides of each LED element, then the alignment can be performed if the separation grooves are on the parting lines.

Figure 12A:
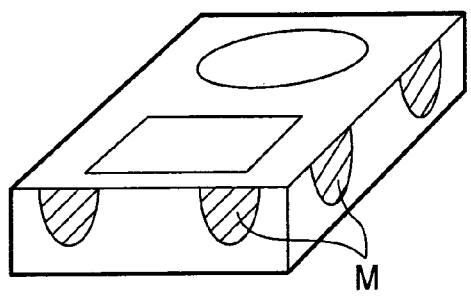
FIG. 12A is a perspective view showing one of LED elements obtained by dividing the wafer depicted in FIG. 11D.
Figure 12B:
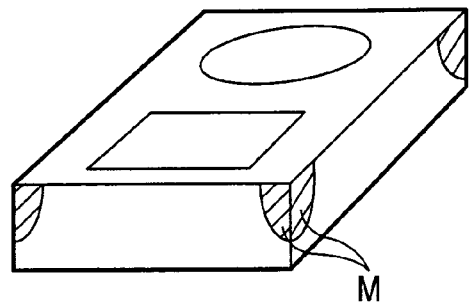
FIG. 12B is a perspective view showing one of LED elements obtained by division on the basis of "full cut" separation grooves formed by laser beam irradiation.
Figure 13A:
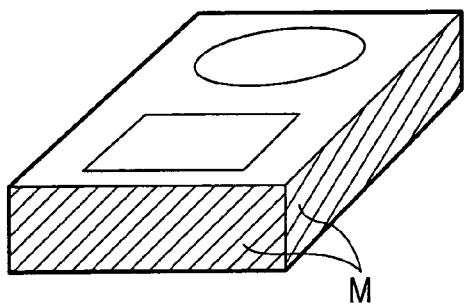
FIG. 13B is a perspective view showing an LED obtained by division on the basis of "half cut" separation grooves formed by laser beam irradiation.
Figure 13B:
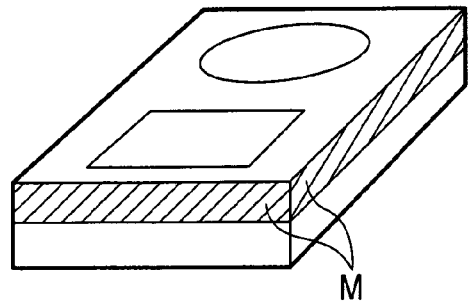

FIG. 12A is a perspective view showing one of LED elements depicted in FIG. 11D after division, and FIG. 12B is a perspective view showing one of LED elements depicted in FIG. 11E after division. In each of FIGS. 12A and 12B, it is obvious that the area occupied by molten portions M formed on the outer circumference of one LED element is sufficiently smaller than the total area of the outer circumference. This fact is more obvious when FIGS. 12A and 12B are compared with FIGS. 13A and 13B. When, for example, so-called "full cut" laser separation grooves are formed as shown in FIG. 13A, the molten portions M are formed on all the outer circumference of each LED element. When, for example, so-called "half cut" laser separation grooves are formed as shown in FIG. 13B, the molten portions M continuous with a predetermined width are formed on the outer circumference of each LED element. On this occasion, the light-emitting efficiency of the LED element obtained in each of FIGS. 13A and 13B is reduced to a value of 0.9 to 0.95 on the assumption that the light-emitting efficiency of the LED element obtained by the related-art dividing method using no laser is regarded as 1. It is obvious that the molten portions M reduce the light-emitting efficiency.

FIGS. 14A to 14D are step views (sectional views) for explaining a specific embodiment of the invention. A Group III nitride compound semiconductor layer 102 was laminated on a sapphire substrate 1 about 300 μm thick so that about 3000 p-n double hetero-junction structure blue LED elements were formed. The laminated structure of the element portion is shown as one layer 102 for the sake of simplification. The total thickness of the Group III nitride compound semiconductor layer except electrodes was about 5 μm. First, groove portions with a maximum depth of 10 μm and a width of about 30 μm were formed along parting lines, which were shaped like a latticed frame having cells indicating blue LED elements respectively, by a diamond-bladed dicer. On this occasion, in the deepest portion of each groove portion, the sapphire substrate 101 was cut by about 5 μm. Incidentally, the groove portions per se are not shown in each of FIGS. 14A to 14D though sections of the groove portions are shown in each of FIGS. 14A to 14D.

Figure 14A:
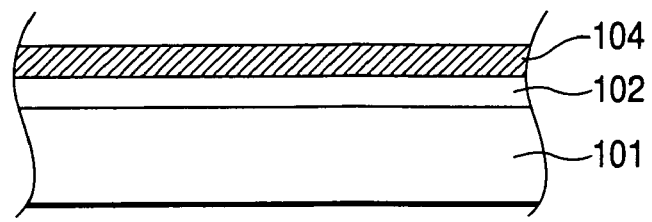
FIGS. 14A to 14D are step views (sectional views) for explaining a specific embodiment of the invention.
Figure 14B:
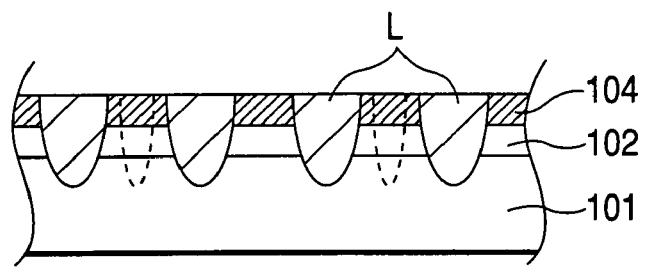
Figure 14C:
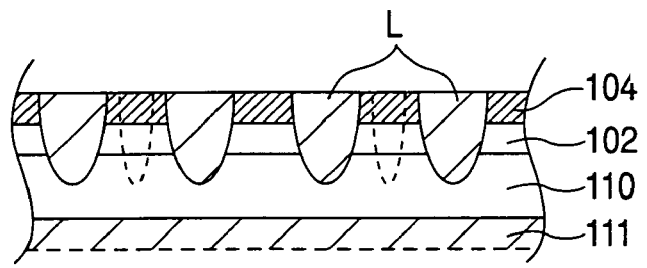
Figure 14D:
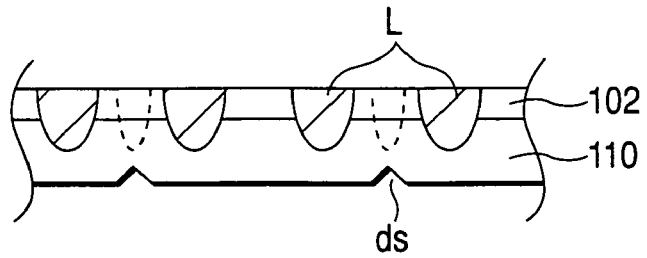

Then, a transparent resin 104 was applied on the whole element-forming surface and cured (FIG. 14A). Then, the third harmonic (wavelength: 355 nm) of a YAG laser was used for applying a laser beam with a beam diameter of about 20 μm along parting lines to thereby form broken line-shaped separation grooves L deeper by a value of 50 μm to 80 μm than the groove portions (FIG. 14B). Then, the rear surface 11 of the sapphire substrate 101 was polished so that the thickness of the sapphire substrate 101 was reduced with the result that a thin-walled wafer 110 having a thickness of 100 μm was obtained (FIG. 14C). Then, rear grooves $d_s$ were formed in the rear surface of the thin-walled wafer 110 by a scriber (FIG. 14D). Then, the transparent resin 104 was removed and the sapphire substrate was divided into individual blue LED elements by means of roller-breaking. As an example, the length $l_L$ of each broken line-shaped separation groove L and the interval $l_{int}$ between adjacent broken line-shaped separation grooves L were selected to be 25 μm and 150 μm respectively when one side of each LED element was 350 μm long. As another example, the length $l_L$ and the interval $l_{int}$ were selected to be 50 μm and 125 μm respectively when one side of each LED element was 350 μm long. As a further example, the length $l_L$ and the interval $l_{int}$ were selected to be 75 μm and 100 μm respectively when one side of each LED element was 350 μm long. In each of the examples, the number of defective products due to breaking and chipping at the time of division was not larger than 10. The light-emitting efficiency of each element in this embodiment was not lower than 0.95 on the assumption that the light-emitting efficiency of each blue LED element obtained by division using no laser was regarded as 1. In this embodiment, there was no deterioration of the light-emitting efficiency due to the laser molten substances. In this manner, when broken line-shaped or dot line-shaped separation grooves are formed according to the invention, Group III nitride compound semiconductor elements small in the area of the molten portions can be formed. Accordingly, in each light-emitting element, the light-emitting efficiency can be restrained from being lowered.

Figure 15A:
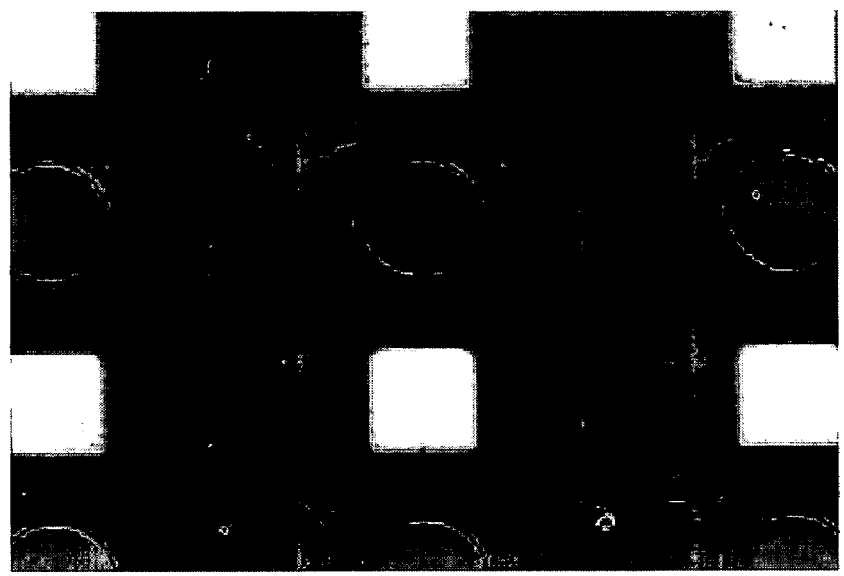
FIGS. 15A and 15B are photographs showing the embodiment after laser scanning.
Figure 15B:
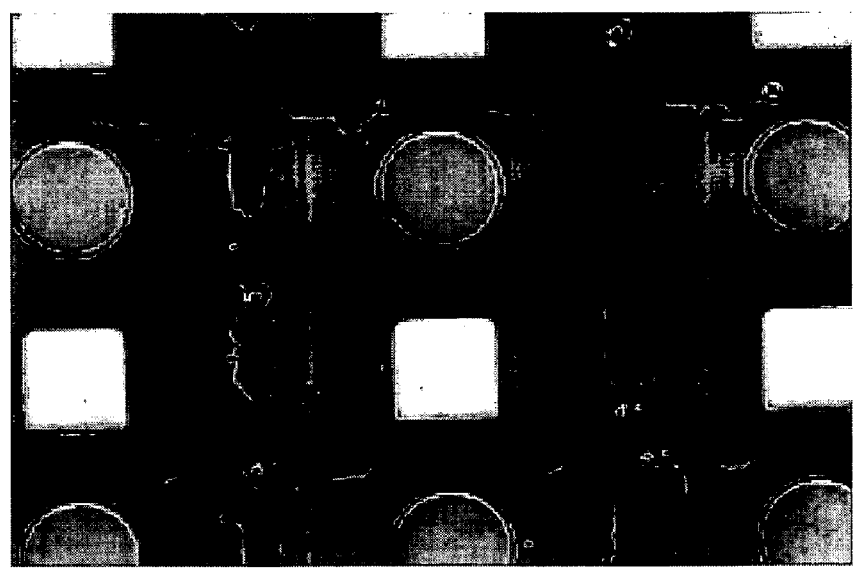
Figure 16A:
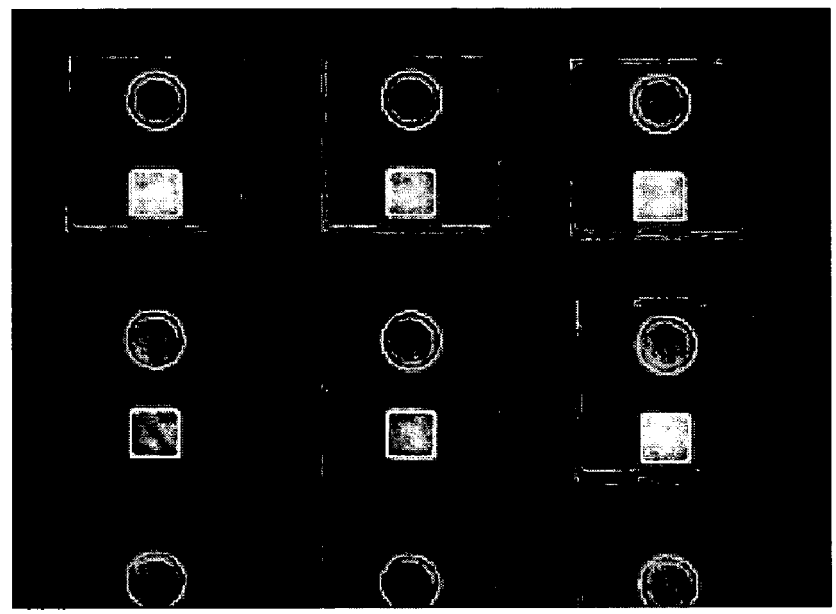
FIGS. 16A and 16B are photographs showing the embodiment after roller-breaking.
Figure 16B:
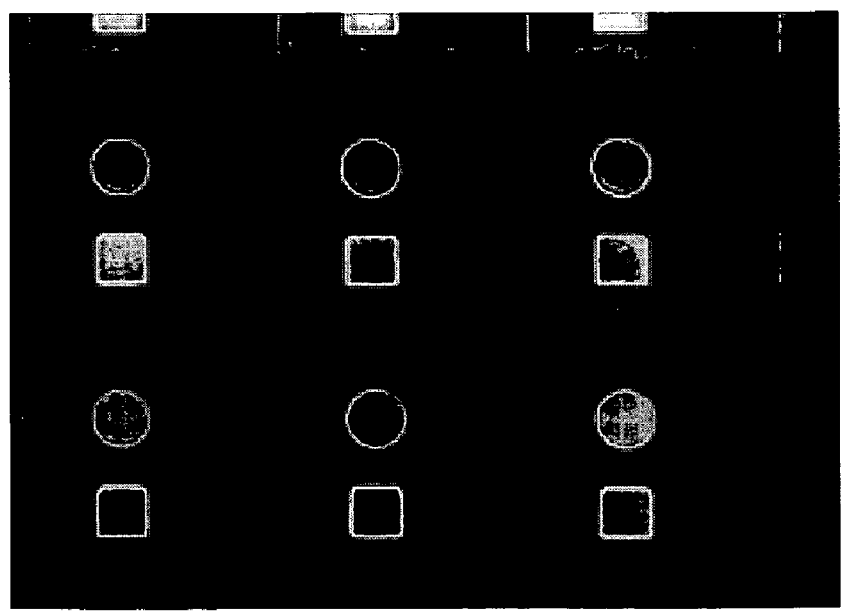
Figure 17A:
FIGS. 17A and 17B are photographs of an outer circumferential portion of each LED element in the embodiment.
Figure 17B:
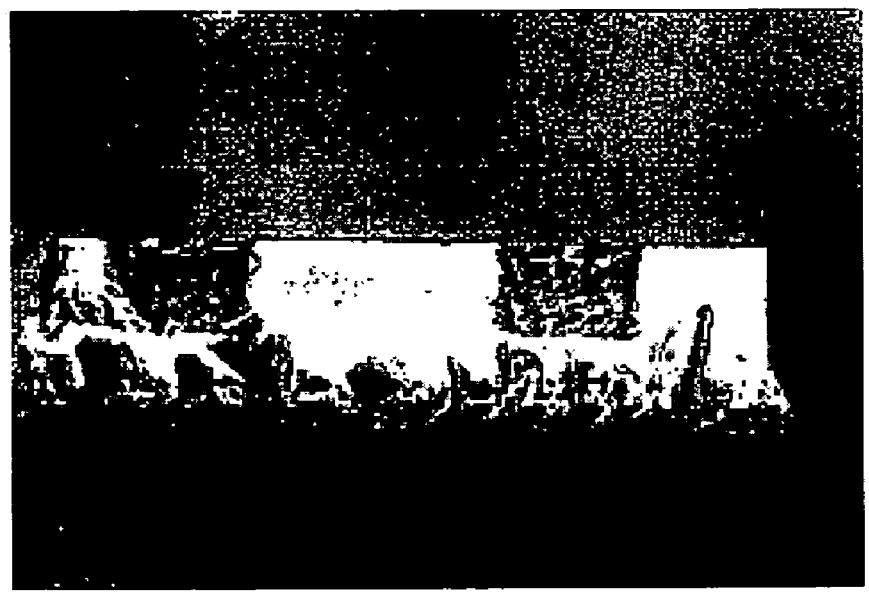
Figure 19A:
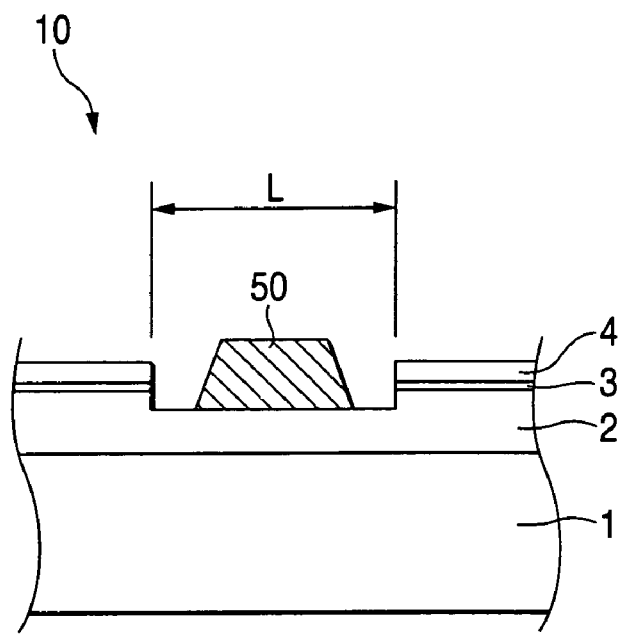
FIGS. 19A and 19B are sectional views showing part of the semiconductor wafer 10.
Figure 19B:
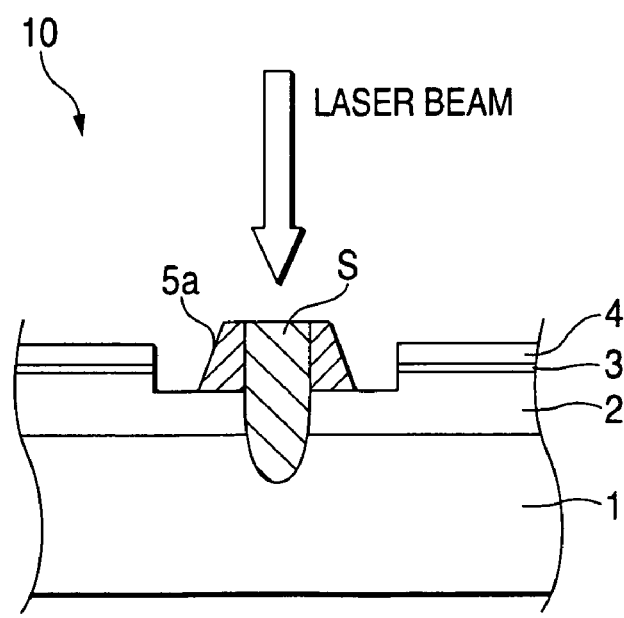

Here are shown photographs in the process for producing LEDs according to this embodiment. FIGS. 15A and 15B are photographs after the separation grooves are formed by laser scanning. FIGS. 16A and 16B are photographs after the substrate is divided into individual LED elements by means of roller-breaking. FIGS. 17A and 17B are photographs of the outer circumferential portion of each of the LED elements. FIGS. 16A, 17A and 18A show the case where the length $l_L$ of each separation groove and the interval $l_{int}$ between adjacent separation grooves are selected to be 25 μm and 150 μm respectively. FIGS. 16B, 17B and 18B show the case where the length $l_L$ and the interval $l_{int}$ are selected to be 75 μm and 120 μm respectively. In each of the cases, it is obvious that breaking or chipping can be avoided as shown in FIGS. 16A and 16B and that the area of the molten portions on the outer circumferential portion can be made small as shown in FIGS. 17A and 17B.

Further, FIGS. 1A to 1G are also step views (sectional views) for explaining the above embodiment from sectional views taken in an another direction since the broken line-shaped or dot line-shaped separation grooves L in the above embodiment are the same as the groove 5 in FIGS. 1A to G. The broken line-shaped or dot line-shaped separation grooves are different from the continuous grooves on the plan view, but the sectional view is the same. Of course, modifications of FIGS. 2A to 2F and FIGS. 3A to 3F can be applied to the fifth embodiment.

[Sixth Embodiment]

Figure 20:
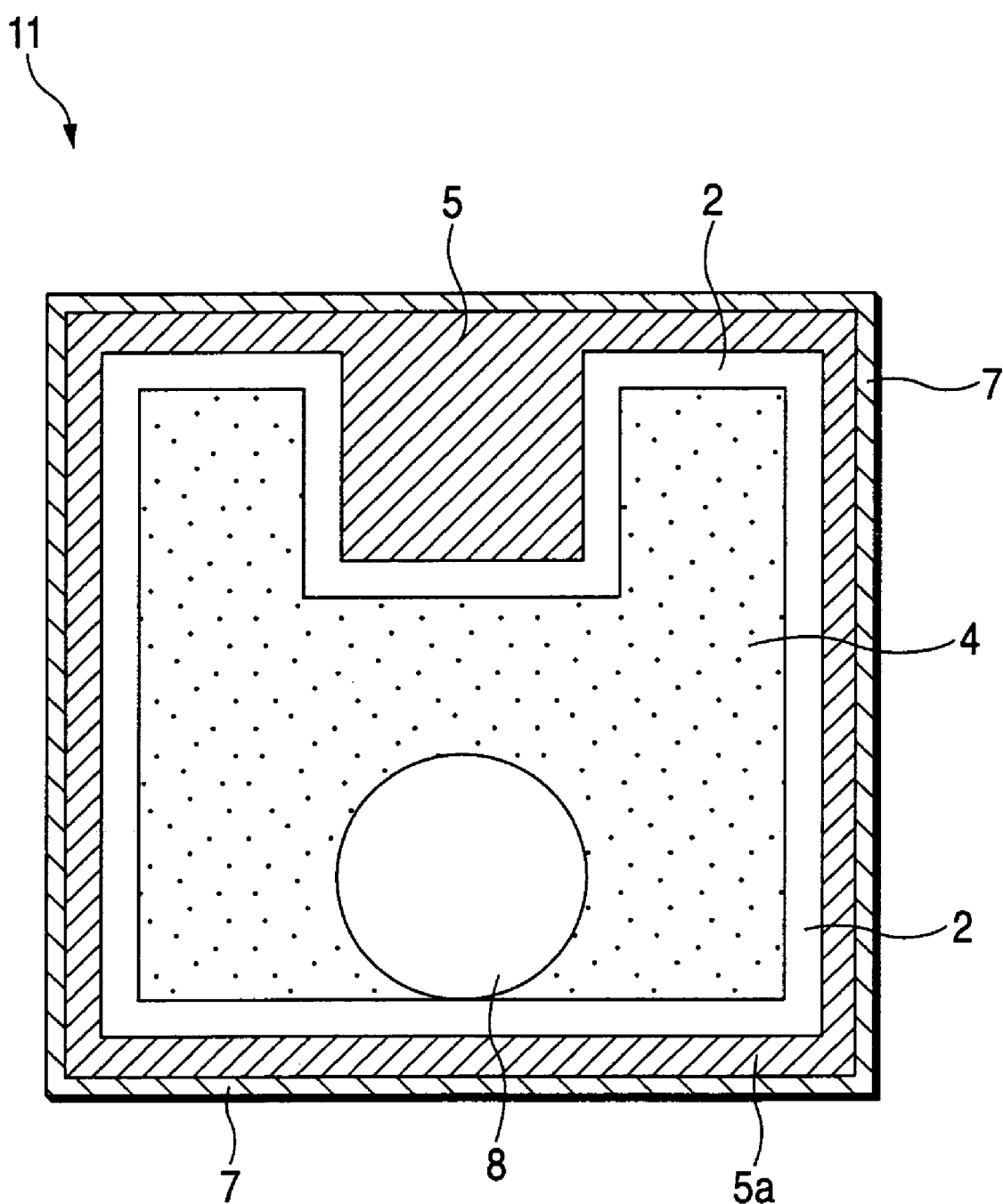
FIG. 20 is a plan view of one of semiconductor chips 11 extracted from the semiconductor wafer 10.

FIG. 20, is a plan view showing a semiconductor chip 11 extracted from a semiconductor wafer 10 (FIG. 18). The semiconductor chip 11 forms a main portion of a wire-bonding type LED.

Figure 28:
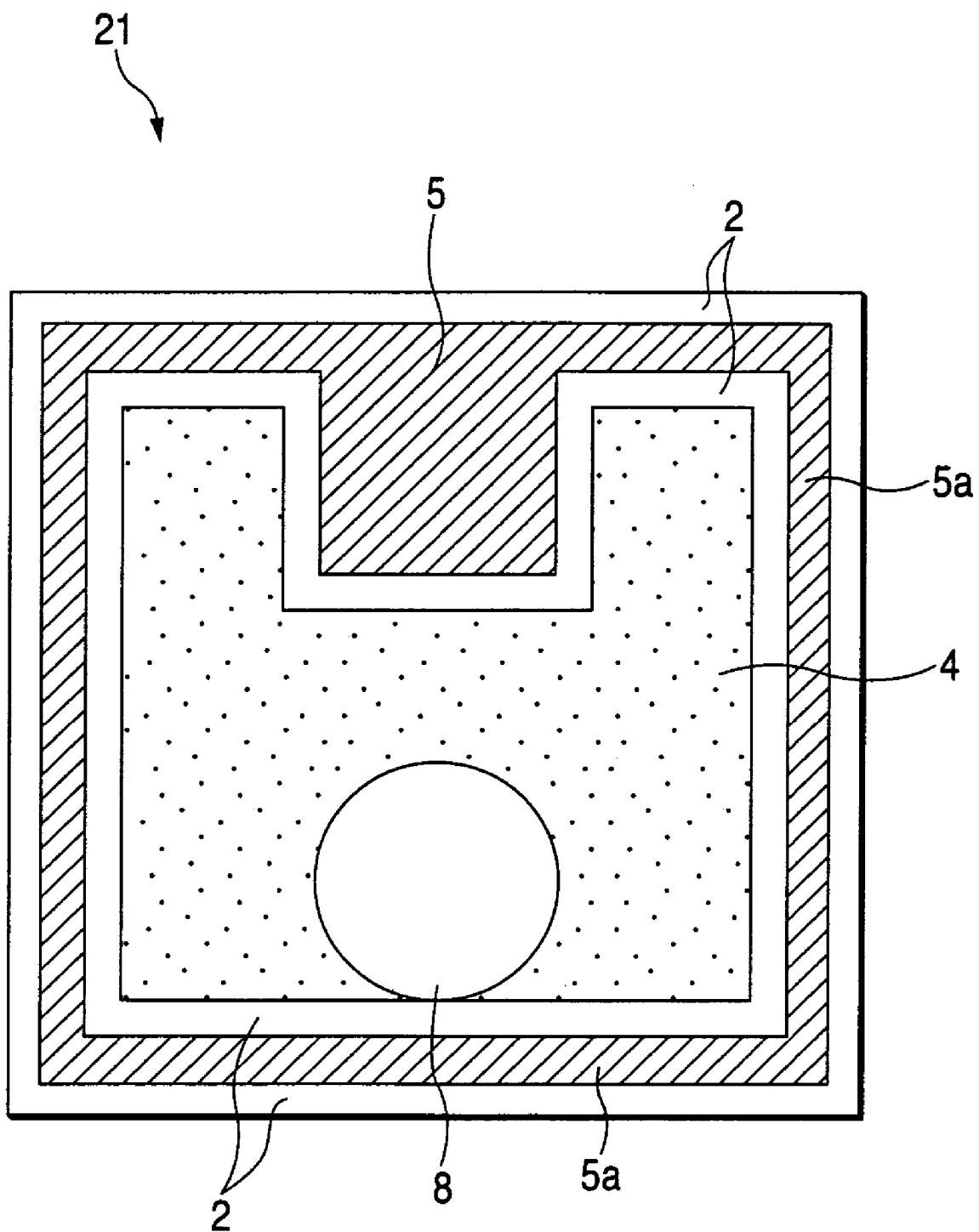
FIG. 28 is a plan view of a semiconductor chip 21 according to the related art.
Figure 30A:
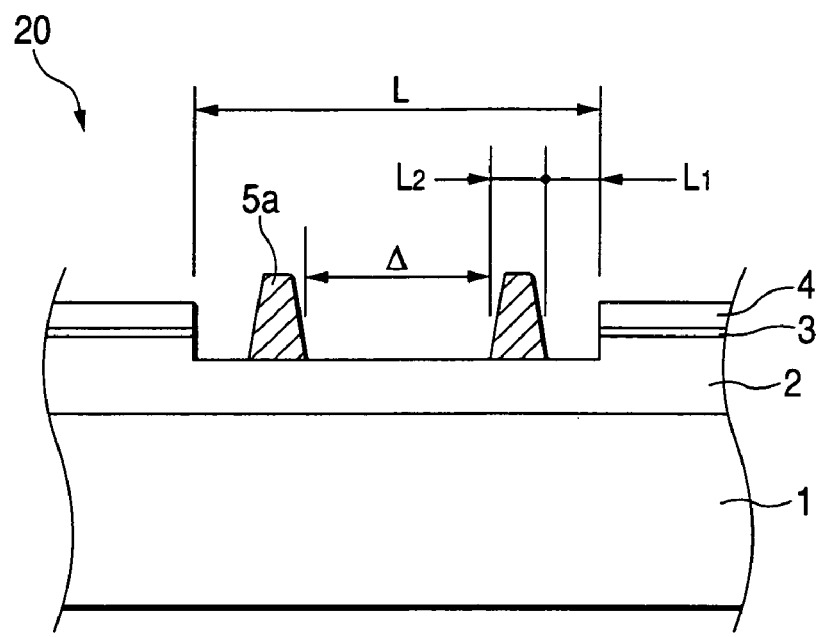
FIGS. 30A and 30B are sectional views showing part of the semiconductor wafer 20.
Figure 30B:
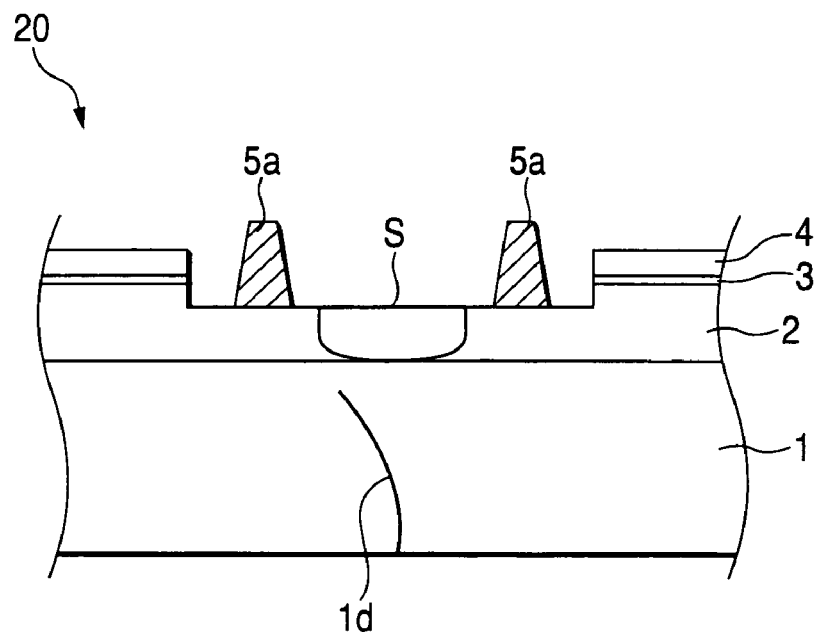
Figure 31:
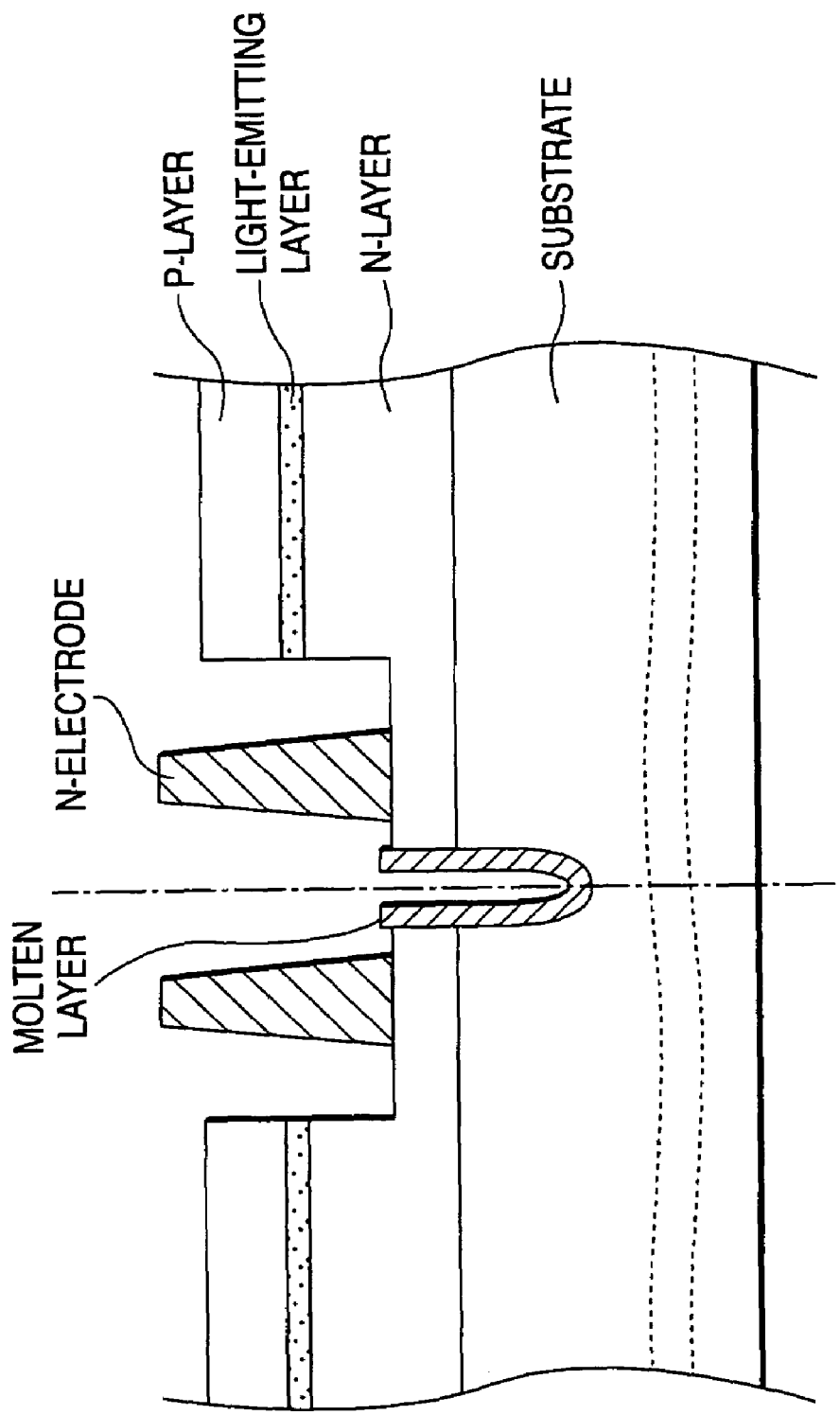
FIG. 31 is a sectional view of another semiconductor wafer for explaining another example of the related art.

The semiconductor chip 11 differs from the semiconductor chip 21 (FIG. 28) in that a molten layer 7 is formed in the semiconductor chip 11 so as to be circled over the circumference of the outer circumferential negative electrode 5a. The reference numeral 8 designates a positive electrode (or electrode pad). A negative electrode 5 having the outer circumferential negative electrode 5a is made of a metal layer 50 (FIG. 18 and FIGS. 21A to 21C) formed on an exposed surface of an n-layer 2 (n-type layer). A translucent thin metal layer may be substantially evenly laminated on a p-layer 4.

(Process of Producing the Semiconductor Wafer 10)

Group III nitride compound semiconductor layers (the n-layer 2, the light-emitting layer 3 and the p-layer 4) having a multilayer structure with a total thickness of about 5 μm are laminated on a crystal growth substrate 1 made of sapphire and having a thickness of about 300 μm to thereby form about 3000 p-n double hetero-junction structure blue LED elements (prototype of semiconductor chips 11). The metal layer 50 is formed by vapor deposition, on a surface of the n-layer 2 exposed by etching. One side of each LED element is about 350 μm long.

(Process of Extracting the Semiconductor Chips 11).

Figure 21A:
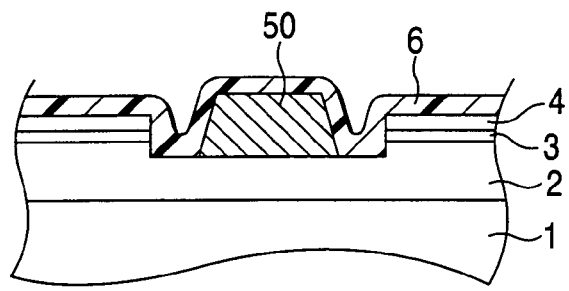
FIGS. 21A to 21C are views showing a procedure for extracting the semiconductor chips 11.
Figure 21B:
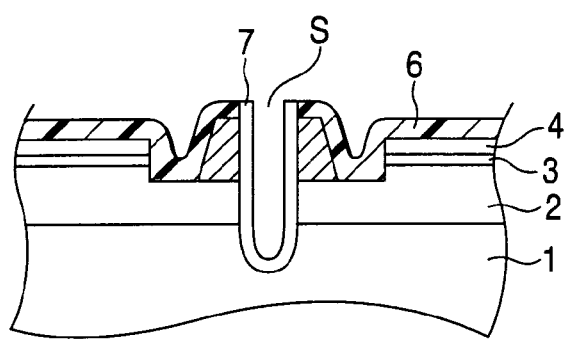
Figure 21C:
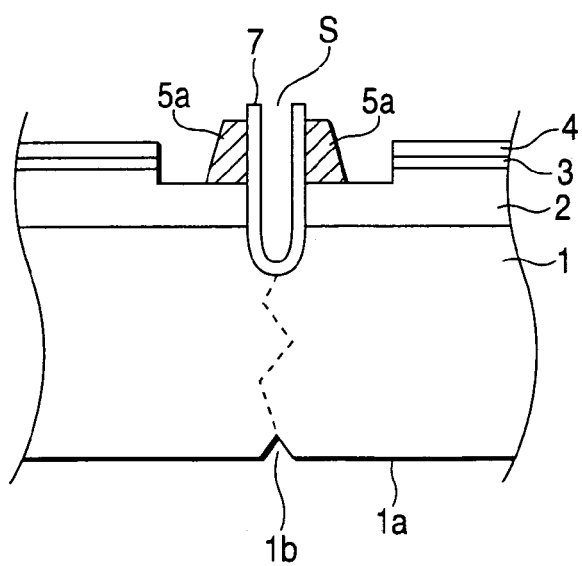

FIGS. 21A to 21C show a procedure for extracting the semiconductor chips 11.

(A) Formation of Protective Film 6

A protective film 6 made of a transparent resin is formed on an upper surface (element-forming surface) of the semiconductor wafer 10 by a resin coating step and a resin curing step (FIG. 21A).

(B) Laser Beam Irradiation Step

Then, the third harmonic (wavelength: 355 nm) of a YAG laser is used for applying a laser beam with a beam diameter of about 10 μm to thereby form continuous line-shaped separation groves S being deeper by a value of about 20 μm to about 30 μm than the exposed surface of the n-layer 2 exposed by etching (FIG. 21B).

(C) Pre-treatment for Division and Division

Then, the protective film 6 is removed and the rear surface of the sapphire substrate 1 is polished so that the thickness of the sapphire substrate 1 is made thin with the result that a thin wafer 10 having a thickness of 100 μm is obtained. In FIG. 21C, the reference numeral 1a designates a processed surface obtained by the polishing.

Then parting lines 1b are formed on the processed surface (the rear surface of the semiconductor wafer 10) by a scriber.

Then, the protective film 6 is removed and the crystal growth substrate 1 is cut by means of roller breaking to thereby divide the semiconductor wafer 10 into individual blue LED elements (semiconductor chips 11 shown in FIG. 20).

Figure 22:
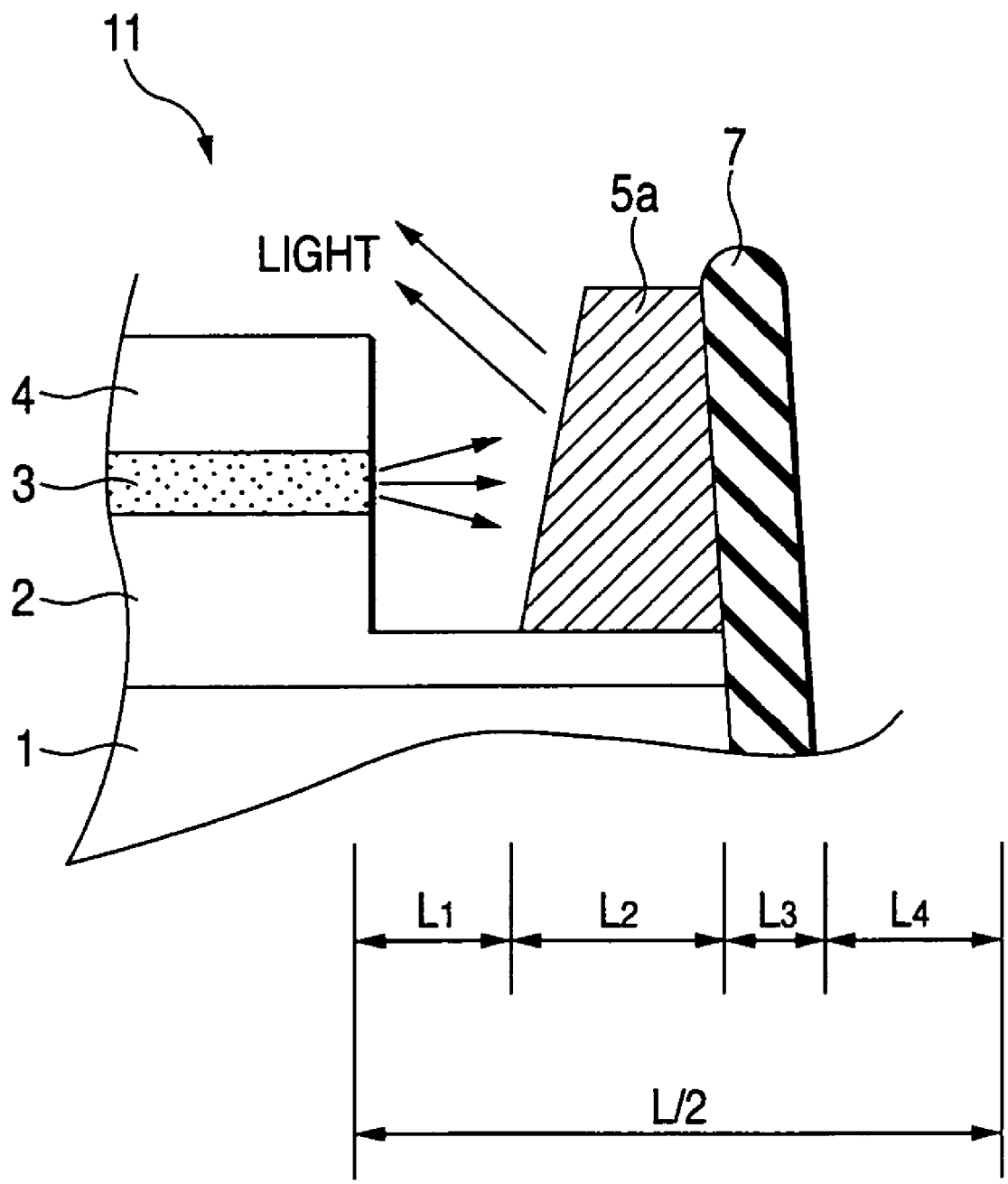
FIG. 22 is a partial sectional view for explaining usefulness of each semiconductor chip 11.

FIG. 22 is a sectional view showing a part of each semiconductor chip 11 for explaining the usefulness of the chip 11 obtained by the aforementioned steps. When, for example, an outer circumferential negative electrode 5a (n-electrode) having a reflecting surface is formed to have a height equal to or greater than the height of the light-emitting layer 3 in the aforementioned manner, light output from the side wall of the light-emitting layer 3 can be also extracted upward. Hence, according to the configuration of the semiconductor chip 11, external quantum efficiency can be kept high.

Furthermore, according to this configuration, a molten layer 7 (equivalent to the molten portion in FIG. 27C) for supplementing/reinforcing the connection strength between the metal layer and each compound semiconductor layer or a not-shown annealing portion equivalent to the heat-affected portion in FIG. 27C is formed in the connection portion between the metal layer (n-electrode 5a) and the compound semiconductor layer (n-layer). Accordingly, the bonding strength between the metal layer for forming the outer circumferential negative electrode 5a and the semiconductor layer (n-layer 2) is reinforced, so that the durability and yield of the element are improved.

The sizes of respective portions obtained by the aforementioned producing method, that is, the distance $L_1$ from a side wall of the light-emitting layer to a light-reflecting surface of the outer circumferential negative electrode, the width $L_2$ of the outer circumferential negative electrode, the thickness $L_3$ of the molten layer, and a half width $L_4$ of each separation groove (the distance $L_4$ from a wall surface of the molten layer to a chip-parting surface), are as follows.

[Numerical Expression 2]

$L_1 \approx 8$ μm, $L_2 \approx 10$ μm, $L_3 \approx 2$ μm, $L_4 \approx 5$ μm, $L = 2(L_1+L_2+L_3+L_4) \approx 50$ μm  (2)

For example, in accordance with the invention, the size L can be reduced greatly in this manner compared with the relate art. Accordingly, semiconductor chips each having an outer circumferential negative electrode 5a and high in light-emitting efficiency can be extracted from the semiconductor wafer with a real efficiency substantially equal to that in the case where related-art semiconductor chips each having no outer circumferential negative electrode 5a are extracted from the semiconductor wafer. That is, according to the invention, semiconductor chips having higher performance than the related-art semiconductor chips but equal in number to the related-art semiconductor chips can be extracted from a semiconductor wafer equal in area to the related-art semiconductor wafer.

The outer circumferential negative electrode 5a prevents increase in drive voltage and irregularity in light emission from being caused by deviation in current density distribution. Accordingly, when the invention is used, an effect of improving internal quantum efficiency greatly can be obtained simultaneously with the effect of improving external quantum efficiency.

Incidentally, in the configuration of the semiconductor element, a translucent metal layer may be widely formed between the p-layer 4 and the positive electrode 8. When, for example, vapor of a suitable metal is deposited on the upper surface of the p-layer 4 so widely and evenly as to be thin, irregularity in light emission is more sufficiently prevented so that an effect of improving light-emitting efficiency can be obtained simultaneously. Such a metal layer (p-electrode) maybe formed as a multilayer structure.

For example, known or optional configurations in various kinds of structures of respective portions described in "Unexamined Japanese Patent Publication No. 2000-188421: Group III Nitride Compound Semiconductor Element" may be used as preferred configurations of wire-bonding type LEDs including configurations of lamination of electrodes.

[Seventh Embodiment]

In the seventh embodiment, a semiconductor chip used in a flip chip type LED is taken as a specific example.

Figure 23A:
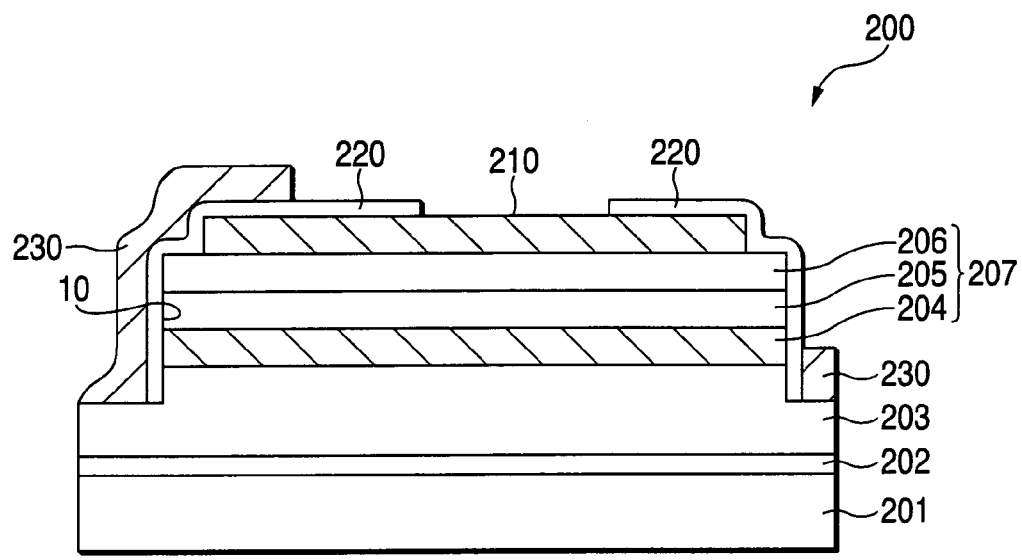
FIG. 23A is a sectional view of a semiconductor chip 200 according to a seventh embodiment of the invention.
Figure 23B:
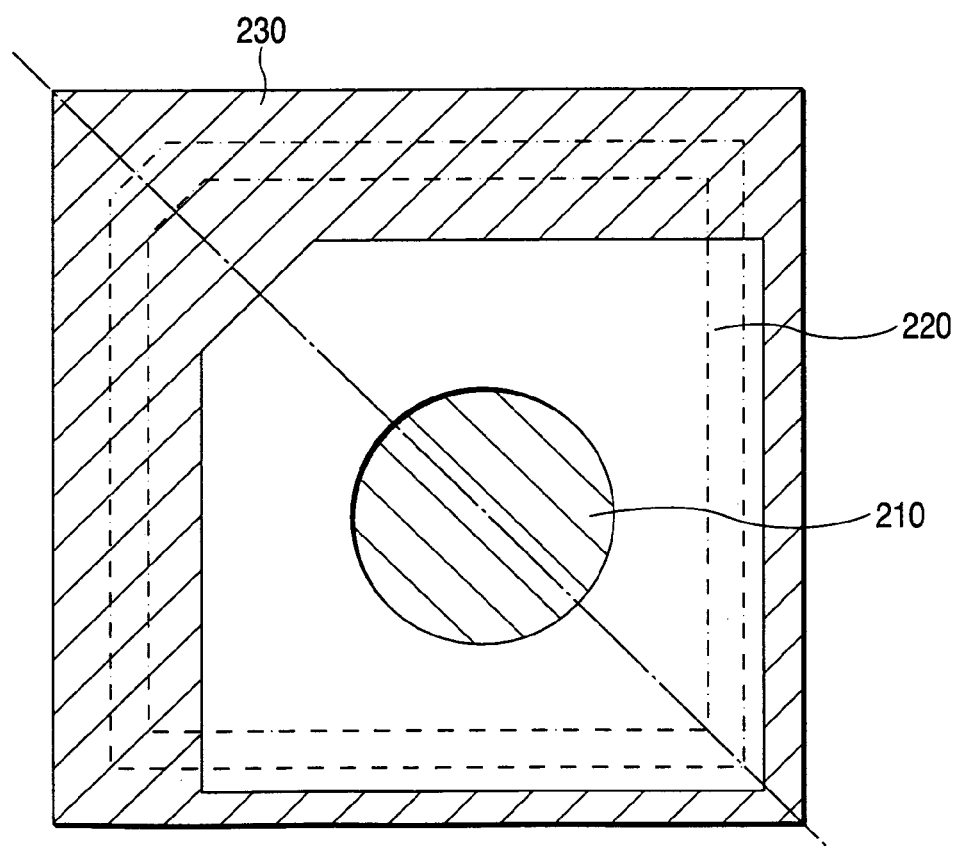
FIG. 23B is a plan view of the semiconductor chip 200.

FIG. 23A is a sectional view showing a semiconductor chip 200 according to the seventh embodiment, and FIG. 23B is a plan view showing the semiconductor chip 200.

In FIGS. 23A and 23B, the reference numeral 201 designates a sapphire substrate; 202, a buffer layer made of aluminum nitride (AlN); 203, an n-type gallium nitride compound semiconductor layer high in carrier density and made of gallium nitride (GaN) doped with silicon (Si); 204, a light-emitting layer made of $In_xGa_{1-x}N$ (0<x<1); and 207, a p-type gallium nitride compound semiconductor layer including a p-type clad layer 205 of p-type $Al_yGa_{1-y}N$ (0<y<1), and a p-type contact layer 206 of p-type gallium nitride (GaN). Further, the reference numeral 210 designates a positive electrode made of nickel (Ni); 220, an electrically insulating film made of $SiO_2$; and 230, a negative electrode (outer circumferential negative electrode) made of V (vanadium)/Al (aluminum). Here, the electrically insulating film 220 is thin and translucent.

That is, a very special feature of the light-emitting element 200 is that the electrically insulating film 220 is formed up to an upper exposed surface of the semiconductor layer 207 (including the layers 205 and 206) and further up to a part of an upper exposed surface of the positive electrode 210 formed on the semiconductor layer 207, via side wall surfaces 10 of the semiconductor layers 204, 205 and 206 from a side wall surface 10 of the n-type semiconductor layer 203 formed by etching. The most special feature of the light-emitting element 200 is that the negative electrode 230 is formed throughout a wide range of from the upper exposed surface of the n-type semiconductor layer 203 to an upper surface of the electrically insulating film 220.

Further, the upper exposed surface of the n-type semiconductor layer 203 made of an n-type gallium nitride compound semiconductor is formed throughout the outer circumference of the light-emitting element 200 so that the negative electrode 230 (outer circumferential negative electrode) is formed throughout the circumference of the upper exposed surface of the n-type semiconductor layer 203.

Further, in the light-emitting element 200, a part of the negative electrode 230 does not reach a position corresponding to an upper portion of the positive electrode 210. This is however insignificant for keeping symmetry of current paths for a current flowing in the n-type semiconductor layer 203. If short-circuiting is apt to occur between the positive and negative electrodes, the configuration as shown in. FIGS. 23A and 23B may be preferably used.

In a sense that light leaked from the side wall surfaces 10 of the semiconductor layers is reflected by the negative electrode so as to be extracted from the sapphire substrate surface side, it is however preferable from the point of view of achievement of high light intensity that the negative electrode 230 reaches a position corresponding to the upper surface of the positive electrode 210 throughout the circumference.

The electrically insulating film 220 is useful as effective means for reducing the distance between the side wall surface 10 and the light-reflecting surface of the negative electrode 230 while keeping electrical insulation between the side wall surface 10 and the negative electrode 230 surely. That is, the distance reducing effect contributes to improvement in semiconductor wafer a real efficiency (i.e., the number of extracted semiconductor chips per unit area of the semiconductor wafer).

For example, as described above, the various means of the invention is also greatly effective for flip chip type LEDs.

When the semiconductor chip 200 is produced for forming a main portion of such a flip chip type LED; the protective film 6 (FIGS. 21A to 21C) used in the first embodiment need not be used because it is also obvious from FIGS. 23A and 23B that the respective semiconductor layers 203, 204 and 207 are covered with the electrically insulating layer 220, and the electrodes 210 and 230. Accordingly, in this case, the protective film formation step and the protective film removal step need not be always provided, so that the laser beam irradiation step can be introduced efficiently.

[Eighth Embodiment]

The invention can be also applied to an LD (semiconductor laser).

The semiconductor light-emitting element taken as an example in the eighth embodiment is an end surface emission type LD (semiconductor laser). Each of separation grooves formed by laser beam irradiation from above the metal layer forming the negative electrode is provided substantially in parallel to a direction of resonance in a resonator of the LD.

Figure 24:
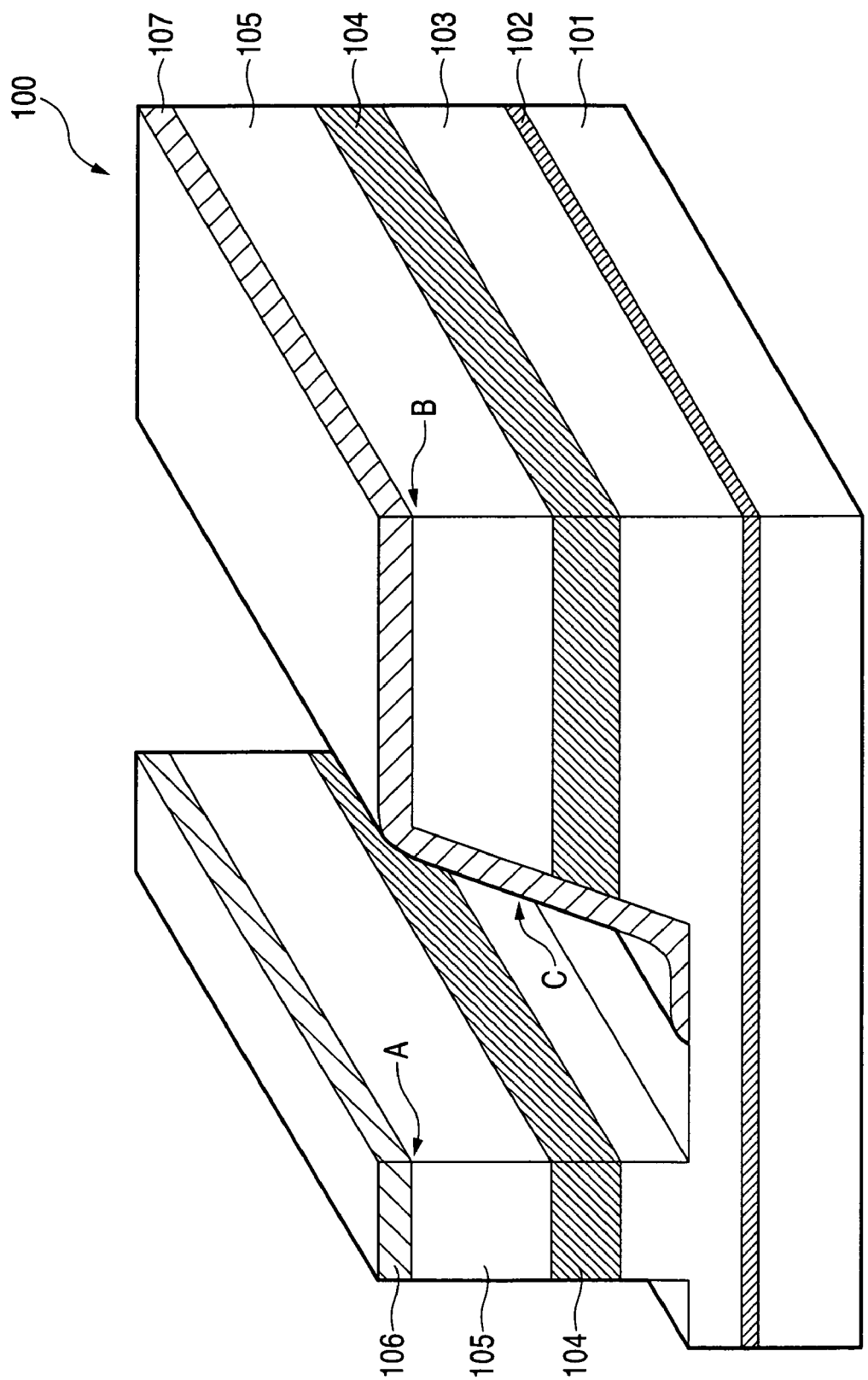
FIG. 24 is a perspective view of a semiconductor chip 100 according to an eighth embodiment of the invention.

FIG. 24 is a perspective view showing a semiconductor chip 100 according to the eighth embodiment.

A buffer layer 102 made of aluminum nitride (AlN) is laminated on a sapphire substrate 101. An n-type layer 103 including a high carrier density n$^+$ layer of GaN doped with silicon (Si), and an n-type clad layer of GaN laminated on the high carrier density n$^+$ layer is further formed on the buffer layer 102.

An end surface emission type active layer 104 as found in a known end surface emission type laser diode is further formed on the n-type layer 103.

A p-type layer 105 including a p-type clad layer of p-type AlGaN doped with magnesium (Mg), and a p-type contact layer of p-type GaN doped with Mg laminated on the p-type clad layer is further formed on the active layer 104.

A part of the n-type layer 103 is exposed by etching from above (the p-type layer 105 side). A flat-top resonator portion and an erosional residual portion are formed by the etching.

In the etching, a resist mask is formed so that the thickness of a portion of the resist mask decreases as the portion of the resist mask is nearer to the resonator. As a result, the depth by which the semiconductor layers are etched can be adjusted. In this manner, a taper portion C is formed.

Incidentally, in FIG. 7, the reference sign A designates a flat top portion of the end surface emission type resonator; B, an upper surface of the uppermost semiconductor layer of the erosional residual portion; and C, a taper portion.

A positive electrode 106 made of nickel (Ni) is formed as a film on the flat top portion (p-type layer 105) of the resonator by vapor deposition.

A negative electrode 107 made of V (vanadium)/Al (aluminum) is formed as a film on an area ranging from the exposed portion of the n-type layer 103 to the upper surface of the uppermost semiconductor layer of the erosional residual portion through the inclined side surfaces (the taper portion) of the semiconductor layers by vapor deposition. Because the inclination of the taper portion is sufficiently gentle compared with other side walls shaped like perpendicular cliffs, the negative electrode 107 with a uniform and sufficient thickness can be also formed in the taper portion C.

That is, the positive electrode 106 and the negative electrode 107 are formed so as to be substantially equal in thickness to each other.

The features, usefulness, etc. of the semiconductor chip 100 (LD) have been described in more detail, for example, in "Unexamined Japanese Patent Publication No. 2001-102673: Group III Nitride Compound Semiconductor Laser Diode".

Figure 25A:
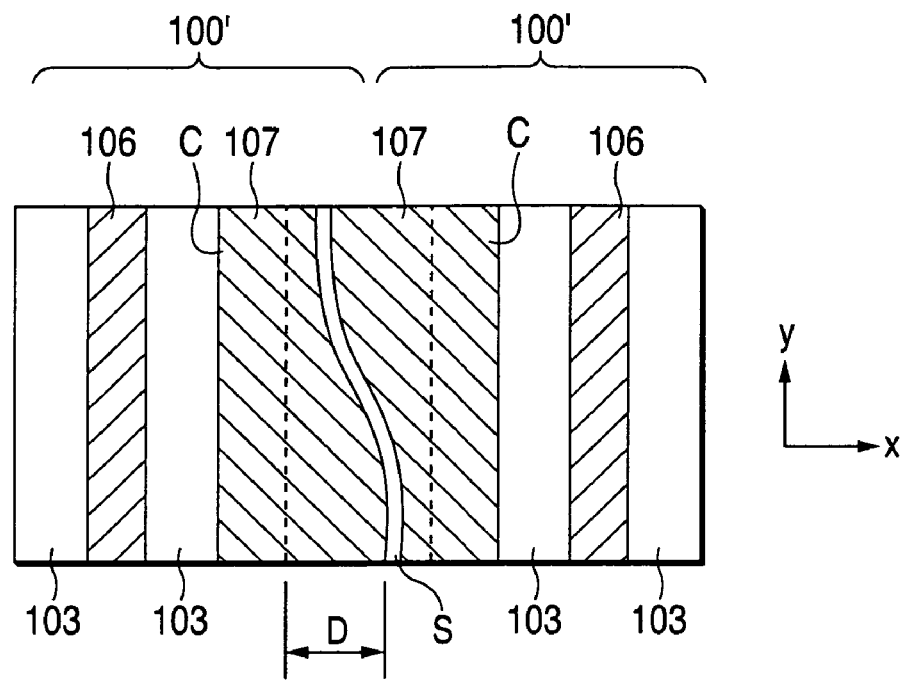
FIG. 25A (or 25B) is a partial plan view showing a method for dividing a semiconductor wafer having a plurality of semiconductor chips 100' (or 100)
Figure 25B:
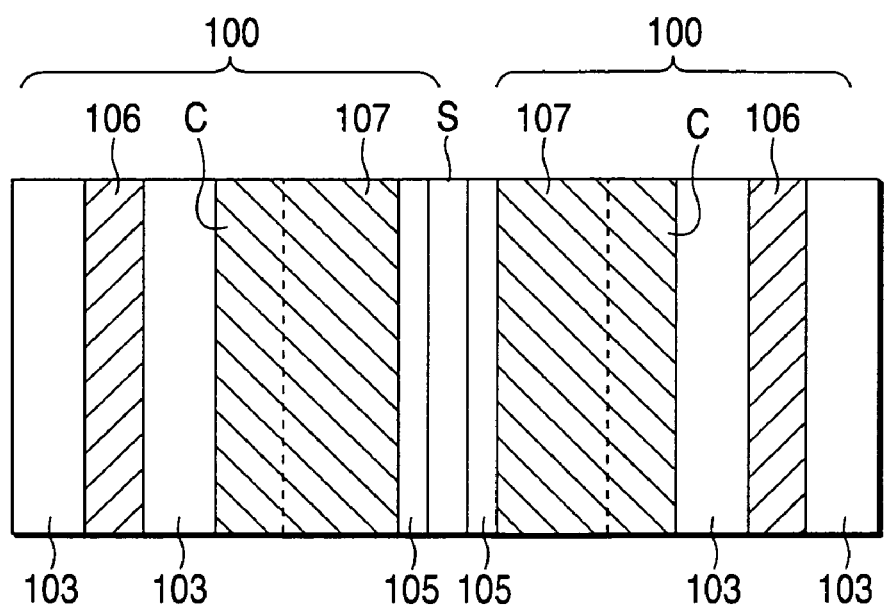
Figure 26A:
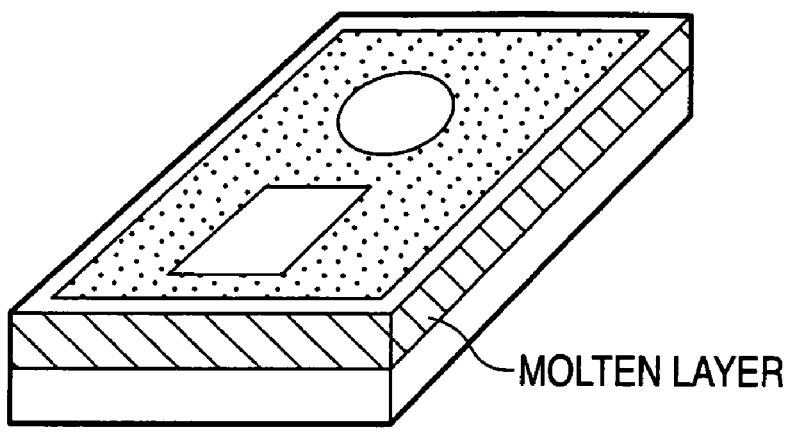
FIGS. 26A and 26B are explanatory views for explaining the general function of a laser beam applied on a semiconductor wafer.
Figure 26B:
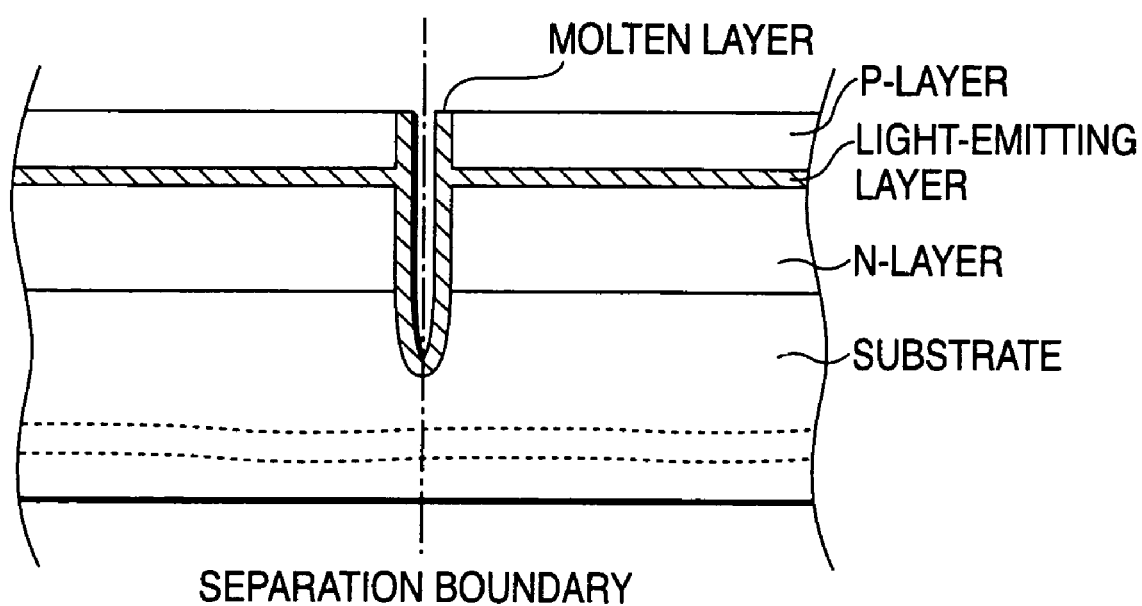

FIG. 25A (or 25B) is a partial plan view showing a method for dividing a semiconductor wafer having a plurality of semiconductor chips 100' (or 100). Incidentally, FIG. 25A shows the dividing method applied to the case where the end surface emission type laser semiconductor chips 100' are extracted according to the invention whereas FIG. 25B shows the dividing method applied to the case where the end surface emission type laser semiconductor chips 100 are extracted according to the related art.

In the dividing method shown in FIG. 25A which is a plan view, continuous line-shaped separation grooves S for dividing a semiconductor wafer into a plurality of semiconductor light-emitting elements are formed by laser beam irradiation from above the metal layer which serves as a negative electrode of each of the semiconductor light-emitting elements formed on the semiconductor wafer. In FIG. 25A, the width of each separation groove is as small as about 10 μm.

When, for example, each of such separation grooves S is processed from above the metal layer forming the negative electrode 107, the size of the semiconductor wafer required for one chip can be reduced greatly in the x-axis direction shown in FIG. 25A by substantially the same function as in the sixth embodiment.

The maximum width D of the flat top portion of the negative electrode 107 in the x-direction (perpendicular to the direction y of resonance of the resonator) is preferably kept at least about 30 µm so that each semiconductor chip 100' can be stably fixed to a heat sink or the like accurately and surely or heat-conducting efficiency can be kept sufficient. However, the width D need not be always kept at all points along the y-direction.

In the step of forming the separation grooves by laser beam irradiation, the separation grooves can be curved easily. This is because there is no directivity in laser beam irradiation though the separation grooves, when a diamond cutter or the like is used, are apt to be formed linearly on the basis of the characteristic of the cutter.

In the dividing method shown in FIG. 25A, therefore, each separation groove S is substantially shaped like a sine wave.

For example, according to this method, the number of semiconductor chips with equal or greater performance allowed to be extracted from one semiconductor wafer having a constant area can be increased.

Incidentally, a subject of the invention is not limited to the LEDs and LDs. For example, in surface emission type LDs, semiconductor photo acceptance elements or other general semiconductor elements, the operation and effect of the invention may be able to be obtained by the means of the invention.

Although various kinds of embodiments are explained in the above separately, the embodiments can be combined and applied to the practical use according to the necessity.

It should be understood that the present invention is not limited to the embodiment description given above, but may variously be modified, altered and changed within the true spirits and scope of the invention.

What is claimed is:

1. A method of producing a plurality of semiconductor elements by individually dividing said semiconductor elements formed on a substrate, said method comprising:
   removing semiconductor layers on parting lines so that (i) only an electrode-forming layer on a side near said substrate remains or (ii) no semiconductor layers remains on said parting lines;
   forming a protective film so that said semiconductor layers are covered with said protective film and said protective film can be removed by an after-process;
   scanning said substrate with a laser beam along said parting lines to form separation grooves in a front surface of said substrate; and
   removing said protective film and unnecessary products produced by said laser beam scanning,
   wherein said separation grooves formed along said parting lines by said laser beam scanning are used for dividing said substrate into individual semiconductor elements.

2. A method of producing a plurality of semiconductor elements according to claim 1, wherein the semiconductor layer removal is carried out in an electrode-forming etching process for exposing an electrode-forming portion of an electrode-forming layer on a side near said substrate by etching.

3. A method of producing a plurality of semiconductor elements according to claim 1, wherein in the semiconductor layer removal, electrode-forming layer side part of said substrate on said parting lines is also removed by dicing.

4. A method of producing a plurality of semiconductor elements according to claim 1, wherein rear grooves corresponding to said separation grooves are formed in a rear surface of said substrate after the protective film and unnecessary product removal.

5. A method of producing a plurality of semiconductor elements according to claim 1, wherein a rear surface of said substrate is polished to reduce the thickness of said substrate after the protective film and unnecessary product removal so that said substrate can be divided into individual semiconductor elements by use of only said separation grooves formed in said front surface of said substrate.

6. A method of producing a plurality of semiconductor elements according to claim 1, wherein a rear surface of said substrate is polished to reduce the thickness of said substrate after the protective film and unnecessary product removal and rear grooves corresponding to said parting lines are then formed in a rear surface of said substrate.

7. The method of claim 1, as embodied in an electronic chip.

8. An apparatus comprising at least one electronic chip fabricated in accordance with the method of claim 1.

9. A method of producing a plurality of semiconductor elements by individually dividing said semiconductor elements formed on a substrate, said method comprising:
   removing semiconductor layers on parting lines so that (i) only an electrode-forming layer on a side near to said substrate remains on said parting lines or (ii) there is no semiconductor layer on said parting lines; and
   scanning said substrate along said parting lines with a laser beam to thereby form broken line-shaped or dot line-shaped separation grooves,
   wherein said broken line-shaped or dot line-shaped separation grooves formed by laser beam scanning along the parting lines are used so that said substrate is divided into individual semiconductor elements.

10. A method of producing a plurality of semiconductor elements according to claim 9, wherein the semiconductor layer removal is carried out by an electrode-forming etching process for exposing an electrode-forming portion of said electrode-forming layer by etching.

11. A method of producing a plurality of semiconductor elements according to claim 9, wherein in the semiconductor layer removal, a part of the element-forming surface of said substrate on said parting lines is also removed by dicing.

12. A method of producing a plurality of semiconductor elements according to claim 9, further comprising:
   forming a protective film so that layers formed on a front surface side of said substrate are covered with said protective film before the laser beam scanning and said protective film can be removed by an after-process; and
   removing said protective film and unnecessary products produced due to laser beam scanning after the laser beam scanning.

13. A method of producing a plurality of semiconductor elements according to claim 9, wherein before said separation grooves are used for dividing said substrate into elements, rear grooves corresponding to said parting lines are formed in a rear surface of said substrate.

14. A method of producing a plurality of semiconductor elements according to claim 9, wherein before said separation grooves are used for dividing said substrate into elements, a rear surface of said substrate is polished to reduce a thickness of said substrate so that said substrate can be divided into individual semiconductor elements only by said separation grooves formed in the front surface of said substrate.

15. A method of producing a plurality of semiconductor elements according to claim 9, wherein before said separation grooves are used for dividing said substrate into elements, a rear surface of said substrate is polished to reduce a thickness of said substrate and then rear grooves corresponding to said parting lines are formed in the rear surface of said substrate.

16. The method of claim 9, as embodied in an electronic chip.

17. An apparatus comprising at least one electronic chip fabricated in accordance with the method of claim 9.

* * * * *